US011128269B2

(12) United States Patent
Maalouf et al.

(10) Patent No.: US 11,128,269 B2
(45) Date of Patent: Sep. 21, 2021

(54) MULTIPLE-STAGE POWER AMPLIFIERS AND DEVICES WITH LOW-VOLTAGE DRIVER STAGES

(71) Applicant: NXP USA, Inc., Austin, TX (US)

(72) Inventors: Elie A. Maalouf, Mesa, AZ (US);
Yu-Ting David Wu, Schaumburg, IL (US); Lu Wang, Chandler, AZ (US);
Nick Yang, Wilmette, IL (US)

(73) Assignee: NXP USA, Inc., Austin, TX (US)

( * ) Notice: Subject to any disclaimer, the term of this patent is extended or adjusted under 35 U.S.C. 154(b) by 29 days.

(21) Appl. No.: 16/718,679

(22) Filed: Dec. 18, 2019

(65) Prior Publication Data

US 2021/0194443 A1 Jun. 24, 2021

(51) Int. Cl.
*H03F 3/191* (2006.01)
*H03F 3/213* (2006.01)
(Continued)

(52) U.S. Cl.
CPC .......... *H03F 3/213* (2013.01); *H01L 23/66* (2013.01); *H03F 1/0227* (2013.01); *H03F 1/0288* (2013.01); *H03F 1/565* (2013.01); *H03F 3/195* (2013.01); *H04B 1/04* (2013.01); *H01L 2223/665* (2013.01); *H01L 2223/6611* (2013.01); *H01L 2223/6655* (2013.01); *H03F 2200/222* (2013.01); *H03F 2200/318* (2013.01); *H03F 2200/411* (2013.01); *H03F 2200/451* (2013.01)

(58) Field of Classification Search
CPC ....................................... H03F 3/191
USPC ................................. 330/302, 305
See application file for complete search history.

(56) References Cited

U.S. PATENT DOCUMENTS 6,127,886 A * 10/2000 Khabbaz ................. H03F 1/342
330/302
7,612,616 B2 * 11/2009 Deng ..................... H03F 1/0205
330/253
(Continued)

FOREIGN PATENT DOCUMENTS

EP        3480945 A1    5/2019

OTHER PUBLICATIONS

Acar, Mustafa et al; "Highly Efficient GaN RF Power Amplifier MMIC Using Low-Voltage Driver"; Proceedings of the 12 Euprean Microwave Integrated circuits Conference, Oct. 9-10, 2017, Nurembert, DE; IEEE; 4 pages (Oct. 2017).
(Continued)

*Primary Examiner* — Henry Choe
(74) *Attorney, Agent, or Firm* — Sherry W. Gourlay

(57) ABSTRACT

An amplifier includes a driver stage amplifier transistor and a final stage amplifier transistor, which are integrated in a semiconductor die. The driver stage amplifier transistor has a driver stage input, a driver stage output, and an output impedance, and the driver stage amplifier transistor is configured to operate using a first bias voltage at the driver stage output. The final stage amplifier transistor has a final stage input, a final stage output, and an input impedance. The final stage input is electrically coupled to the driver stage output. The final stage amplifier transistor is configured to operate using a second bias voltage at the final stage output, and the second bias voltage is at least twice as large as the first bias voltage.

20 Claims, 8 Drawing Sheets

(51) Int. Cl.
| | |
|---|---|
| *H01L 23/66* | (2006.01) |
| *H03F 1/02* | (2006.01) |
| *H03F 1/56* | (2006.01) |
| *H03F 3/195* | (2006.01) |
| *H04B 1/04* | (2006.01) |

(56) References Cited

U.S. PATENT DOCUMENTS

| | | |
|---|---|---|
| 10,250,197 B1 | 4/2019 | Schultz |
| 2009/0009244 A1 | 1/2009 | Banba |

OTHER PUBLICATIONS

Freescale Semiconductor, Inc.; "50V RF LDMOS"; downloaded from https://www.nxp.com/docs/en/white-paper/50VRFLDMOSWP.pdf; pp. 1-13 (Sep. 2011).
Microsemi Power Products Group; "DRF1300(G) MOSFET Push-Pull Hybrid"; downloaded from http://www.microsemi.com; pp. 1-4 (Dec. 2009).
RFHIC; "GaN Hybrid Power Amplifier HM0225-05A"; downloaded from http://rfhic.com/eng/prod/view.html?idx=182; pp. 1-6 (Feb. 2016).
Agah, Amir et al., "A 11% PAE, 15.8-dBm Two-Stage 90-GHz Stacked-FET Power Amplifier in 45-nm SOI CMOS", IEEE—MYYS International Microwave Symposium Digest, Jun. 2, 2013, pp. 1-3, IEEE, Piscataway, NJ, USA.
Tired, Tobias et al., "A 1 V power amplifier for 81-86 GHz E-band", Analog Integrated Circuits and Signal Processing, Jun. 4, 2014, pp. 335-348, vol. 80, No. 3, Springer New York LLC, New York, NY, USA.

\* cited by examiner

US 11,128,269 B2

MULTIPLE-STAGE POWER AMPLIFIERS AND DEVICES WITH LOW-VOLTAGE DRIVER STAGES

TECHNICAL FIELD

Embodiments of the subject matter described herein relate generally to radio frequency (RF) amplifiers, and more particularly to power transistor devices and amplifiers, and methods of manufacturing such devices and amplifiers.

BACKGROUND

An ever-growing demand in wireless communication systems is higher efficiency to reduce operational and system costs. In a wireless communication system transmitter, the radio frequency (RF) power amplifier is one the most power consuming elements, and often the transmitter RF power amplifier has the highest impact on total power dissipated. Accordingly, amplifier and transmitter designers strive to develop RF power amplifiers with reduced power consumption and power loss, while maintaining or improving efficiency and RF bandwidth.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
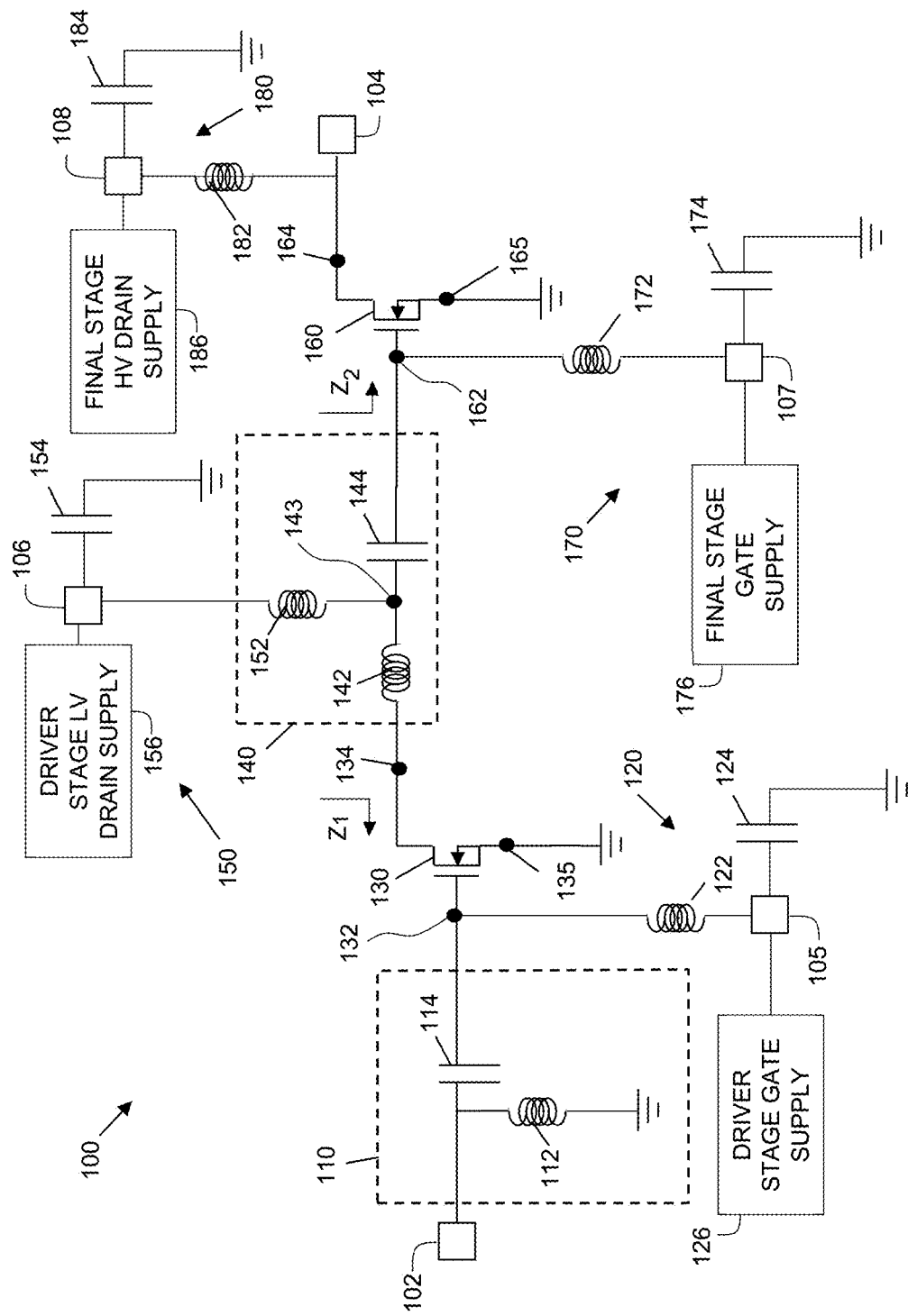
FIG. 1 is a schematic circuit diagram of a power amplifier circuit, in accordance with an example embodiment.

An embodiment of an amplifier includes a driver stage amplifier transistor and a final stage amplifier transistor integrated in a semiconductor die. The driver stage amplifier transistor has a driver stage input, a driver stage output, and an output impedance, and the driver stage amplifier transistor is configured to operate using a first bias voltage at the driver stage output. The final stage amplifier transistor has a final stage input, a final stage output, and an input impedance, where the final stage input is electrically coupled to the driver stage output. The final stage amplifier transistor is configured to operate using a second bias voltage at the final stage output, and the second bias voltage is at least twice as large as the first bias voltage.

According to a further embodiment, the driver stage amplifier transistor has an output impedance, the final stage amplifier transistor has an input impedance, and a ratio of the output impedance of the driver stage amplifier transistor to the input impedance of the final stage amplifier transistor input is less than 10:1. According to another further embodiment, the amplifier further includes an interstage impedance matching circuit electrically coupled between the driver stage output and the final stage input, and the interstage impedance matching circuit is configured to perform an impedance transformation from the output impedance of the driver stage amplifier transistor to the input impedance of the final stage amplifier. According to yet another further embodiment, the output impedance of the driver stage amplifier is less than 10 ohms, and the second impedance is less than 5 ohms. According to yet another further embodiment, the driver stage amplifier transistor is characterized by a first drain-source on resistance, and the final stage amplifier transistor is characterized by a second drain-source on resistance that is greater than the first drain-source resistance. According to yet another further embodiment, the driver stage amplifier transistor is characterized by a first breakdown voltage, and the final stage amplifier transistor is characterized by a second breakdown voltage that is at least 100 percent higher than the first breakdown voltage. According to yet another further embodiment, the driver stage amplifier transistor is characterized by a first power density, and the final stage amplifier transistor is characterized by a second power density that is at least 200 percent greater than the first power density. According to yet another further embodiment, the semiconductor die is a silicon-based die, the driver amplifier transistor is a first laterally-diffused metal oxide semiconductor (LDMOS) field effect transistor (FET), and the final stage amplifier is a second LDMOS FET. According to yet another further embodiment, the driver stage amplifier transistor has a first transistor finger that includes a first gate structure with a first sidewall, a first drain region, and a first drift region extending from the first sidewall to the first drain region, and where the driver stage amplifier transistor is characterized by a first drain-source on resistance, and the final stage amplifier transistor has a second transistor finger that includes a second gate structure with a second sidewall, a second drain region, and a second drift region extending from the second sidewall to the second drain region, where the final stage amplifier transistor is characterized by a second drain-source on resistance that is greater than the first drain-source resistance. According to yet another further embodiment, the first drift region and the second drift region have one or more different characteristics selected from different doping levels, different drift region widths, different drift region depths, and different drift region lengths. According to yet another further embodiment, the first drift region has a first length between the first sidewall and the first drain region, and the second drift region has a second length between the second sidewall and the second drain region, where the second length is at least 50 percent larger than the first length.

Another embodiment of an amplifier includes a driver stage field effect transistor (FET) and a final stage FET integrated in a semiconductor die. the driver stage FET has a driver stage input, a driver stage output, and an output impedance, and the driver stage amplifier transistor is characterized by a first breakdown voltage. The final stage FET has a final stage input, a final stage output, and an input impedance, and the final stage amplifier transistor is characterized by a second breakdown voltage that is at least 100 percent higher than the first breakdown voltage. The amplifier further includes an interstage impedance matching circuit electrically coupled between the driver stage output and the final stage input, where the interstage impedance matching circuit is configured to perform an impedance transformation from the output impedance of the driver stage amplifier transistor to the input impedance of the final stage amplifier.

According to a further embodiment, a ratio of the output impedance to the input impedance is less than 10:1. According to another further embodiment, the output impedance of the driver stage FET is less than 10 ohms, and the input impedance of the final stage FET is less than 5 ohms. According to yet another further embodiment, the driver stage FET is characterized by a first power density, and the final stage FET is characterized by a second power density that is at least 200 percent greater than the first power density. According to yet another further embodiment, the driver stage FET is characterized by a first drain-source on resistance, and the final stage FET is characterized by a second drain-source on resistance that is greater than the first drain-source on resistance. According to yet another further embodiment, the amplifier further includes an amplifier substrate, and a power amplifier module coupled to the amplifier substrate, where the power amplifier module includes the semiconductor die in which the driver stage FET and the final stage FET are integrated, a first connector coupled to the substrate and configured to receive a first bias voltage, a second connector coupled to the substrate and configured to receive a second bias voltage, a first conductive path coupled between the first connector and the driver stage output, and a second conductive path coupled between the second connector and the final stage output. According to yet another further embodiment, the amplifier further includes a pre-amplifier module coupled to the substrate, and a third conductive path coupled between the first connector and the pre-amplifier module.

An embodiment of a method of operating an amplifier that includes a driver stage amplifier transistor and a final stage amplifier transistor coupled in series and integrated in a semiconductor die, includes the steps of providing an output of the driver stage amplifier transistor with a first bias voltage, and providing an output of the final stage amplifier transistor with a second bias voltage, where the second bias voltage is at least twice the first bias voltage. According to a further embodiment, the first bias voltage is less than 10 volts, and the second bias voltage is greater than 20 volts. According to another further embodiment, the driver stage amplifier transistor and the final stage amplifier transistor are embodied in a power amplifier module coupled to a substrate, the amplifier further includes a pre-amplifier module coupled to the substrate, and the method further includes providing the pre-amplifier module with the first bias voltage.

Disclosed herein are embodiments of an RF power amplifier architecture that includes a low voltage driver stage (e.g., 5 volts (V)) and a high voltage final stage (e.g., 28-32 V), where "low voltage driver stage" means a power amplifier transistor that is configured to operate with a relatively low output bias voltage (e.g., drain bias voltage), and "high voltage final stage" means a power amplifier transistor that is configured to operate with a relatively high output bias voltage (e.g., drain bias voltage). Compared with conventional, two-stage amplifiers that bias the outputs of both their driver and final stages with the same relatively high voltage (e.g., a voltage of 28 V or more), the RF power amplifier architectures disclosed herein may have several potential advantages.

For example, given the relatively low output bias voltage, the low voltage driver stage embodiments disclosed herein may be designed to have a significantly lower output impedance (e.g., $Z_1$, or the impedance looking into the drain of the driver stage transistor) than a conventional high voltage driver stage that has its output biased with a higher voltage (e.g., 28 V or more). For example, an embodiment of a low voltage driver stage may have an output impedance of less than 10 ohms, whereas a conventional high voltage driver stage may have an output impedance of 60 ohms or more. Given that the input impedance of the final stage (e.g., $Z_2$, or the impedance looking into the gate of the final stage transistor) may be just a few ohms (e.g., 2-5 ohms or less), it is apparent that an embodiment of an interstage impedance matching network between the low voltage driver stage output and the high voltage final stage input may be characterized by a significantly reduced impedance transformation ratio (i.e., a ratio of the output impedance of the driver stage to the input impedance of the final stage), when compared with the impedance transformation ratio than would be required for a conventional two-stage amplifier. For example, for a conventional two-stage power amplifier, a 28 V driver stage may require an impedance transformation ratio on the order of 30:1 to 50:1 (e.g., from about 60-100 ohms $Z_1$ to about 2 ohms $Z_2$), while an embodiment of a low voltage driver stage may only require an impedance transformation ratio of less than 10:1 (e.g., on the order of 2.5:1 to 5:1, corresponding to an impedance transformation ratio from about 5-10 ohms $Z_1$ to about 2 ohms $Z_2$).

As only a relatively low impedance transformation ratio is needed, an interstage impedance matching network for the various embodiments may be relatively simple (e.g., fewer impedance matching stages and passive components). Accordingly, the interstage impedance matching network losses may be significantly reduced (e.g., by 3 decibels (dB) or more) during operation, when compared with the losses incurred by conventional, two-stage amplifiers.

Assuming a 3 dB interstage match loss reduction, for example, the required output power from the low voltage driver stage also may be reduced by 3 dB. Accordingly, the direct current (DC) power consumption of an embodiment of a low voltage driver stage also may be reduced, in comparison with a conventional, high voltage driver stage. In other words, the DC power consumption of embodiments of a low voltage driver stage discussed herein may be significantly less than the DC power consumption of conventional driver stages. Essentially, with relatively few matching stages and components, the power dissipated in an embodiment of an interstage matching network is significantly reduced, when compared with conventional, two-stage power amplifiers, further contributing to an efficiency boost.

Further, for wireless infrastructure applications, power amplifiers typically are required to operate at an average power of about 8-9 dB back off from peak power. While the final stage operates at back off, the driver stage operates at far back off, but typically with low efficiency. As a result, the DC power consumption reduction achieved using an embodiment of the inventive subject matter actually may be multiples of the driver output power, which leads to significant overall line-up efficiency improvement. Further still, implementation of a relatively simple interstage impedance matching network, in accordance with the various embodiments, may result in a wider RF bandwidth than is achievable using conventional, two-stage amplifiers.

The driver and final stage transistors can be integrally formed on a single semiconductor substrate (e.g., both the driver and final stages are silicon-based transistors integrated in a single semiconductor chip), with the driver stage transistor customized for low voltage operation, and the final stage transistor customized for high voltage operation. Accordingly, a more integrated line-up may be achieved, which makes for a cost-effective and high-throughput solution that is attractive and suitable for massive multiple-input/multiple-output (MIMO) applications.

Furthermore, embodiments of the invention may leverage the use of a standardly available, low voltage power supply (e.g., a 5 V supply), which also may be used to power other RF subsystems of an RF transmitter or transceiver (e.g., a transmitter power amplifier pre-driver, a transmit/receive switch, a duplexer, and/or a receiver low noise amplifier). Therefore, the low voltage power supply may not present a unique requirement that would have otherwise added system cost.

Figure 2:
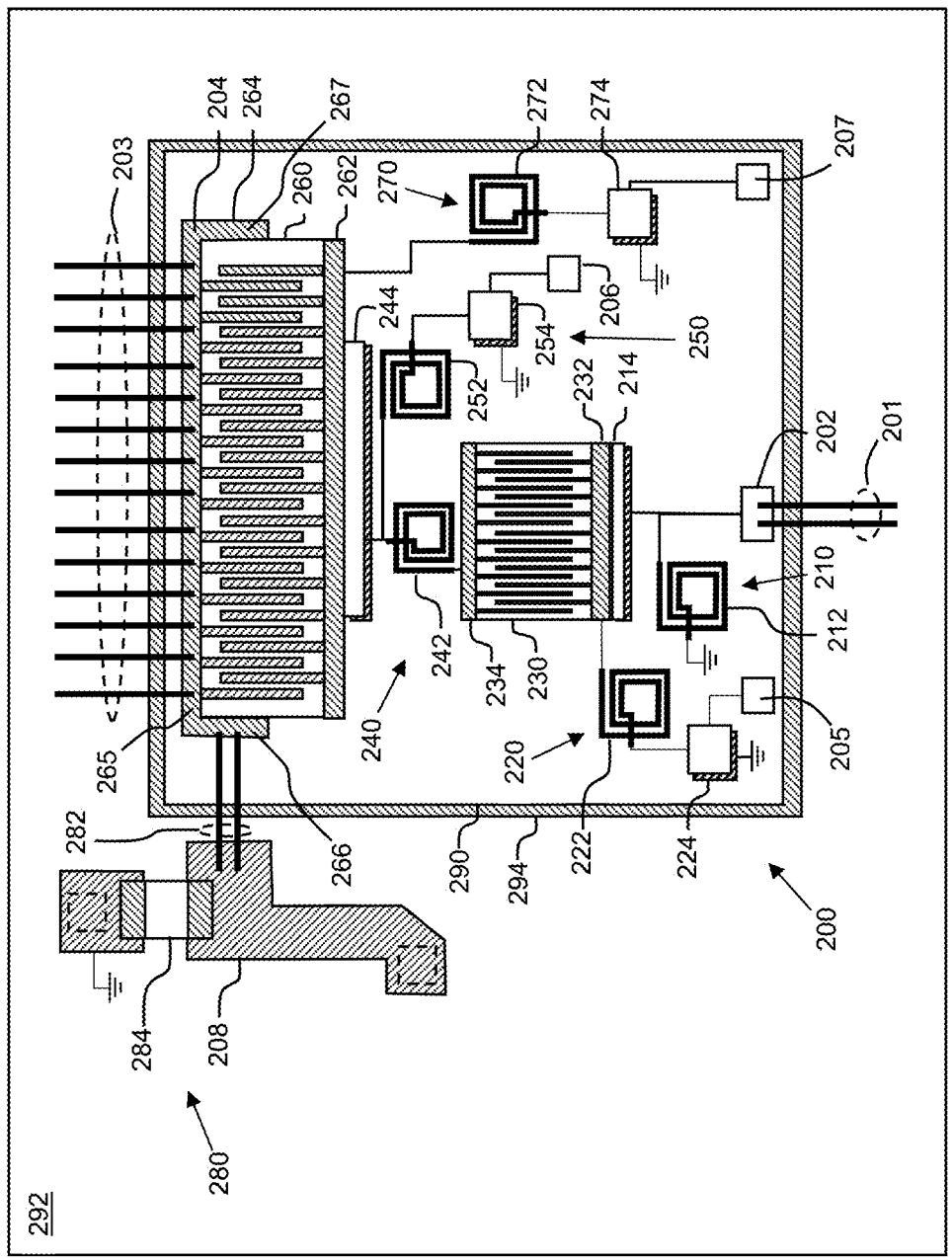
FIG. 2 is a top view of a two-stage power amplifier integrated circuit (IC), in accordance with an example embodiment.

FIG. 1 is a schematic circuit diagram of a power amplifier circuit 100 that includes a low voltage driver stage and a high voltage final stage, and FIG. 2 is a top view of a two-stage power amplifier integrated circuit (IC) 200 that embodies the power amplifier circuit 100 of FIG. 1, in accordance with various example embodiments. For clarity and brevity, FIGS. 1 and 2 will be described together, below.

As best illustrated in FIG. 2, many of the components of IC 200 that correspond to components of circuit 100 may be coupled to or integrally-formed with a single semiconductor die 290, which is mounted to a mounting surface of a host substrate 292. For example, as will be described in more detail in conjunction with FIG. 6, the host substrate 292 may be a small printed circuit board (PCB), although the host substrate 292 alternatively may be a conductive package flange or other suitable substrate. As will also be described in more detail in conjunction with FIG. 6, the host substrate 292 may include an embedded, electrically and thermally conductive coin 294 or thermal vias, which is/are configured to provide a ground reference voltage and to function as a heat sink, and the semiconductor die 290 may be mounted to the conductive coin 294 or thermal vias.

Power amplifier circuit 100 and power amplifier IC 200 each include an RF input 102, 202, an input impedance matching circuit 110, 210, a driver stage transistor 130, 230, an interstage impedance matching circuit 140, 240, a final stage transistor 160, 260, first and second input (gate) bias circuits 120, 170, 220, 270, first and second output (drain) bias circuits 150, 180, 250, 280, and an RF output 104, 204, in an embodiment. It should be noted that, in the embodiment of FIG. 2, the second output (drain) bias circuit 280 actually is implemented off chip (i.e., circuit 280 is electrically coupled to, but not integrally formed with IC 200). In an alternate embodiment, the second output (drain) bias circuit 280 may be implemented on-chip, similar to the implementations of bias circuits 220, 250, and 270.

RF input 102, 202 and RF output 104, 204 each may include a conductor, which is configured to enable the circuit 100 and IC 200 to be electrically coupled with external circuitry (not shown). For example, as depicted in FIG. 2, the RF input 202 includes a conductive bondpad, which is exposed at the top surface of the die 290, and which is configured for attachment of a set of one or more wirebonds (e.g., wirebond array 201, FIG. 2). Conversely, the RF output 204 is electrically coupled to (or is a same conductive structure as) an output/drain terminal 264 of the final stage transistor 260, which also may be a conductive bondpad that is exposed at the top surface of the die 290. The first set of wirebonds 201 is configured to convey an input RF signal from external circuitry (e.g., pre-amplifier 730, FIG. 7) to the RF input 202, and the second set of wirebonds 203 is configured to convey an output RF signal from the RF output 204 to external circuitry (e.g., duplexer 760, FIG. 7).

The input impedance matching circuit 110, 210 is electrically coupled between the RF input 102, 202 and an input/gate terminal 132, 232 of driver stage transistor 130, 230. Further, interstage impedance matching circuit 140, 240 is electrically coupled between an output/drain terminal 134, 234 of the driver stage transistor 130, 230 and an input/gate terminal 162, 262 of final stage transistor 160, 260. An output/drain terminal 164, 264 of the final stage transistor 160, 260 is electrically coupled to (or is a same conductive structure as) the RF output 104, 204.

Each transistor 130, 160, 230, 260 is characterized by input and output impedances, with the output impedance of transistor 130, 230 ($Z_1$) and the input impedance of transistor 160, 260 ($Z_2$) being most relevant to the inventive subject matter, as will be discussed below in detail. The input and interstage impedance matching circuits 110, 210 each are configured to perform a desired impedance transformation to, from, or between the input and output impedances of transistors 130, 160, 230, 260.

For example, the input impedance matching circuit 110, 210 is configured to raise the impedance of circuit 100 or IC 200 to a higher (e.g., intermediate or higher) impedance level (e.g., in a range from about 2 to about 50 Ohms or higher). According to an embodiment, input impedance matching circuit 110, 210 includes a shunt inductive element 112, 212 and a series capacitance 114, 214. The shunt inductive element 112, 212 has a first terminal electrically coupled to the RF input 102, 202, and a second terminal electrically coupled to a ground reference node (e.g., to conductive layer 380, FIGS. 3, 4, with through substrate vias (TSVs) or through doped sinker regions). The series capacitance 114, 214 has a first terminal (or electrode) electrically coupled to the RF input 102, 202, and a second terminal (or electrode) electrically coupled to the input/gate terminal 132, 232 of transistor 130, 230. According to an embodiment, inductive element 112, 212 may have an inductance value in a range between about 0.1 nanohenries (nH) to about 10 nH, and capacitance 114, 214 may have a capacitance value in a range between about 0.1 picofarads (pF) to about 30 pF, although each of these components may have component values lower or higher than the above-given ranges, as well.

The interstage impedance matching circuit 140, 240 is configured to match the output impedance (Z1) of driver stage transistor 130, 230 to the input impedance (Z2) of final stage transistor 160, 260. According to an embodiment, the interstage impedance matching circuit 140, 240 includes a series inductive element 142, 242, a series capacitance 144, 244, and a shunt inductive element 152, 252. The series inductive element 142, 242 and the series capacitance 144, 244 are coupled in series with each other between the output/drain terminal 134, 234 of the driver stage transistor 130, 230 and the input/gate terminal 162, 262 of the final stage transistor 160, 260, with an intermediate node 143 between the two series-coupled components. More particularly, the series inductive element 142, 242 has a first terminal electrically coupled to the output/drain terminal 134, 234 of the driver stage transistor 130, 230, and a second terminal electrically coupled to the intermediate node 143, and the series capacitance 144, 244 has a first terminal (or electrode) electrically coupled to the intermediate node 143, and a second terminal (or electrode) electrically coupled to the input/gate terminal 162, 262 of the final stage transistor 160, 260. The shunt inductive element 152, 252 has a first terminal electrically coupled to the intermediate node 143, and a second terminal electrically coupled to a ground reference node (e.g., through capacitance 154, 254). According to an embodiment, inductive element 142, 242 may have an inductance value in a range between about 0.1 nH to about 10 nH, capacitance 144, 244 may have a capacitance value in a range between about 0.1 pF to about 30 pF, and inductive element 152, 252 may have an inductance value in a range between about 0.1 nH to about 10 nH, although each of these components may have component values lower or higher than the above-given ranges, as well.

As illustrated in FIG. 2, inductive elements 112, 142, 152, 212, 242, 252 and capacitances 114, 144, 214, 244 may be integrally formed in semiconductor die 290. For example, inductive elements 112, 142, 152, 212, 242, 252 may be implemented as spiral inductors that are formed from patterned conductive portions of the build-up layers of die 290 (e.g., layers 304, FIGS. 3, 4), and capacitances 114, 144, 214, 244 may be implemented as metal-insulator-metal (MIM) capacitors that are formed in the build-up layers of die 290. In alternate embodiments, some or all of the inductive elements 112, 142, 152, 212, 242, 252 and capacitances 114, 144, 214, 244 may be implemented as surface-mount, "chip" components, which are physically coupled to the top surface of die 290, and electrically coupled through bondpads or other contacts (not shown) exposed at the top surface of die 290. Further, in other alternate embodiments, some or all of the inductive elements 112, 142, 152, 212, 242, 252 may be implemented as wirebonds.

Driver stage and final stage transistors 130, 160, 230, 260 are the primary active components of circuit 100 and IC 200. Each of the transistors 130, 160, 230, 260 is configured to amplify an RF signal conducted through the transistor 130, 160, 230, 260. As used herein, the term "transistor" means a field effect transistor (FET) or another type of suitable transistor. For example, a "FET" may be a metal-oxide-semiconductor FET (MOSFET), a laterally-diffused MOS-FET (LDMOS FET), an enhancement-mode or depletion-mode high electron mobility transistor (HEMT), or another type of FET. The description herein refers to each transistor as including an input terminal (or control terminal) and two current-conducting terminals. For example, using terminology associated with FETs, an "input terminal" refers to a gate terminal of a transistor, and first and second current-conducting terminals refer to drain and source terminals (or vice versa) of a transistor.

Driver stage transistor 130, 230 includes an input terminal 132 (e.g., a gate terminal 232), a first current conducting terminal 134 (e.g., an "output" or drain terminal 234), and a second current conducting terminal 135 (e.g., a source terminal, not shown in FIG. 2). Similarly, final stage transistor 160, 260 includes an input terminal 162 (e.g., a gate terminal 262), a first current conducting terminal 164 (e.g., output/drain terminal 264), and a second current conducting terminal 165 (e.g., a source terminal, not shown in FIG. 2).

Figure 3:
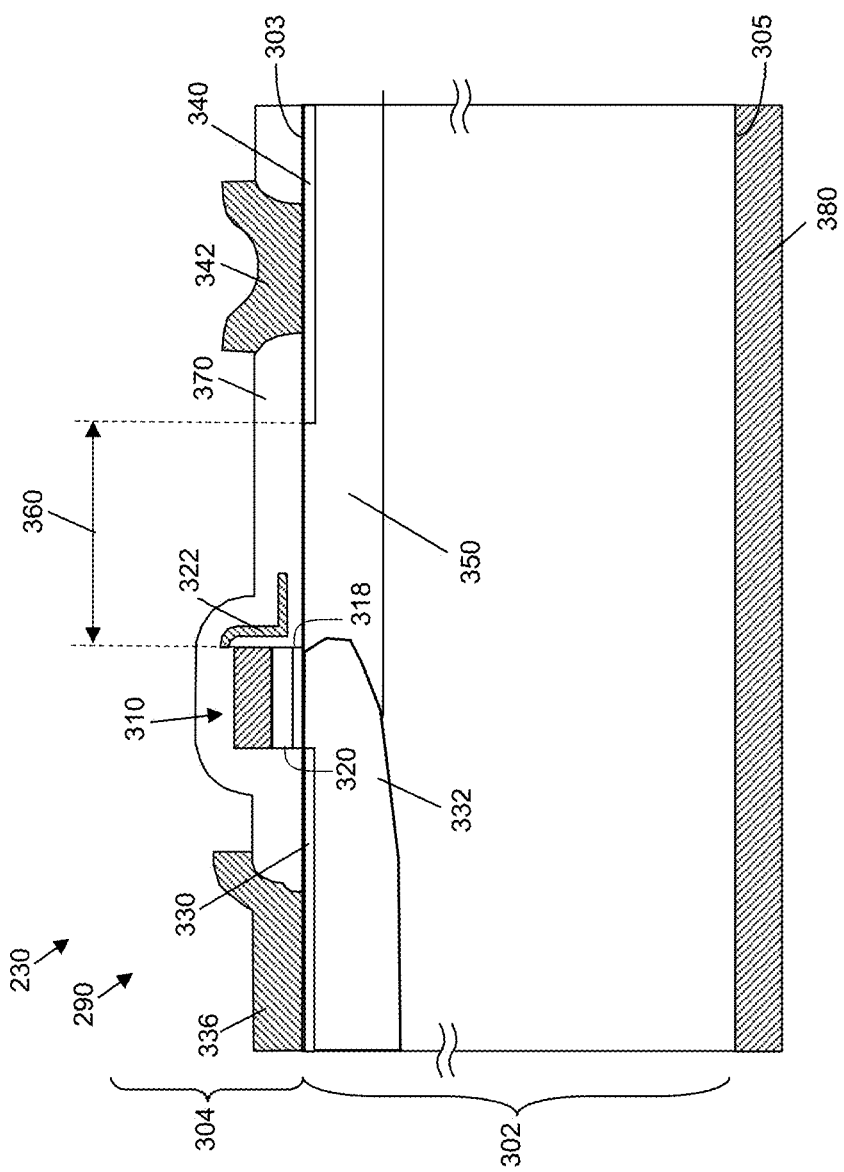
FIG. 3 is a cross-sectional, side view of a portion of the driver amplifier transistor of FIG. 2, in accordance with an embodiment.
Figure 4:
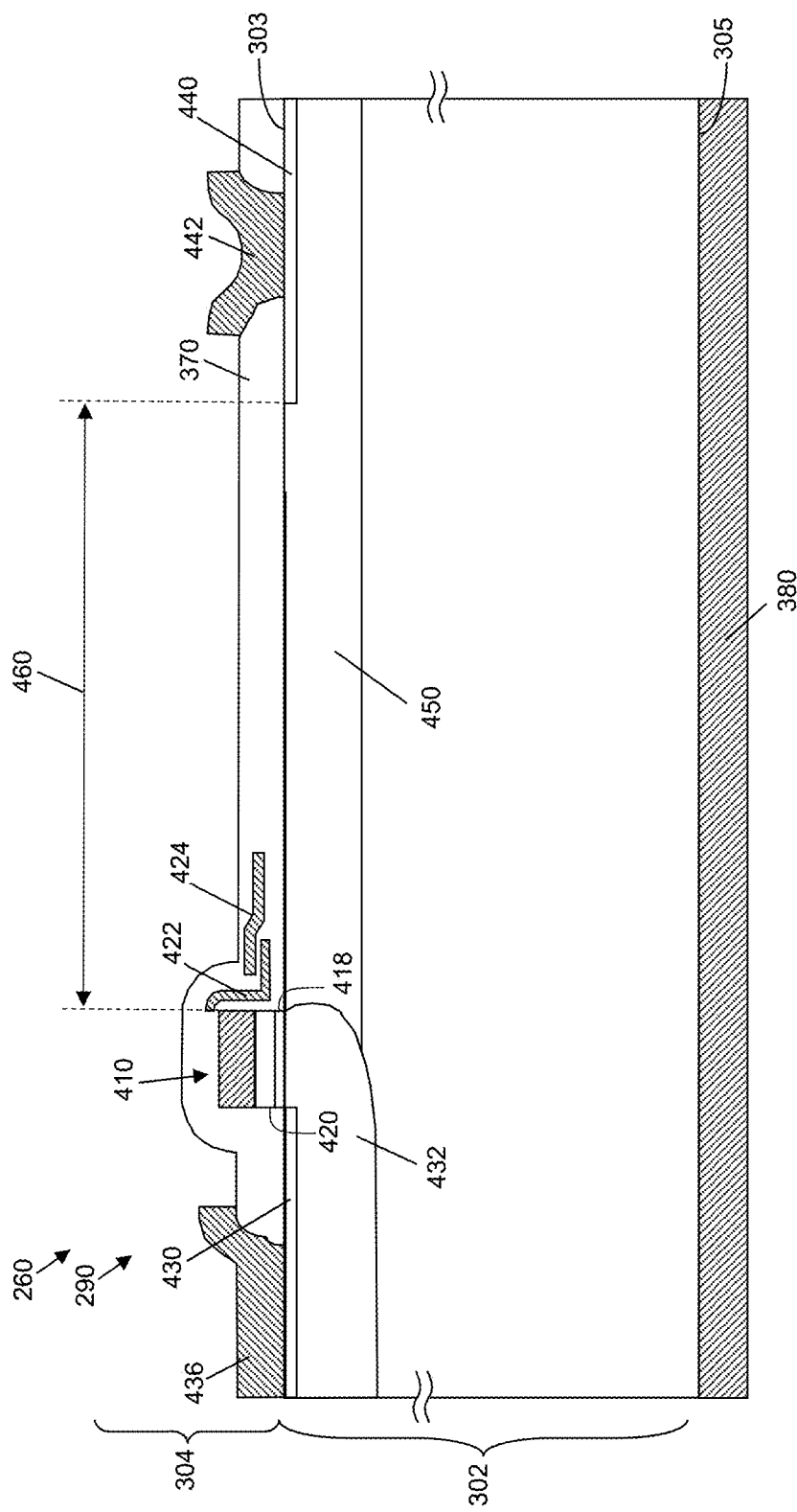
FIG. 4 is a cross-sectional, side view of a portion of the final stage amplifier transistor of FIG. 2 in accordance with an embodiment.

In a specific embodiment, each transistor 130, 160, 230, 260 includes an active area disposed between its input/gate terminals 132, 162, 232, 262 and output/drain terminals 134, 164, 234, 264. As best shown in FIGS. 2-4, the active areas of transistors 230, 260 each include a plurality of elongated, parallel-aligned, and interdigitated drain regions (e.g., multiple, parallel-aligned instances of drain region 340, 440, FIGS. 3, 4) and source regions (e.g., multiple, parallel-aligned instances of source region 330, 430, FIGS. 3, 4), where each drain region and each source region is a doped semiconductor region formed in a base semiconductor substrate (e.g., substrate 302, FIG. 3).

A variably-conductive channel region and a drain drift region (e.g., drift regions 350, 450, FIGS. 3, 4) are present between adjacent source regions and drain regions. Conductive (e.g., polysilicon or metal) gate structures (e.g., gate structures 310, 410, FIGS. 3, 4) extend over and along the elongated channel regions. The gate structures of transistor 230 are electrically coupled together with a first gate manifold, and the gate structures of transistor 260 are electrically coupled together with a second gate manifold. Each of the gate manifolds of transistors 230, 260 are closely electrically coupled to their respective input/gate terminals 232, 262. Similarly, the drain regions of transistor 230 are electrically coupled together with first drain manifold, and the drain regions of transistor 260 are electrically coupled together with second drain manifold. Each of the drain manifolds of transistors 230, 260 are closely electrically coupled to their respective output/drain terminals 234, 264. Due to their elongated shapes, each set of adjacent drain and source regions, along with a gate structure (e.g., gate structures 310, 410, FIGS. 3, 4) overlying a channel region between the adjacent drain and source regions, may be referred to as a "transistor finger." Each transistor 130, 160, 230, 260 includes a plurality of parallel transistor fingers within the active area of the transistor.

In various embodiments, amplifier circuit 100 and amplifier IC 200 each include DC bias circuits 120, 150, 170, 180, 220, 250, 270, 280, which are configured to provide DC bias voltages to the input/gate terminals 132, 162, 232, 262 and output/drain terminals 134, 164, 234, 264 of transistors 130, 160, 230, 260. Each of the input DC bias circuits 120, 170, 220, 270 is configured as a "shunt inductance" (or shunt-L) circuit, which includes an inductive element 122, 172, 222, 272 and a capacitor 124, 174, 224, 274 connected in series between a transistor input/gate terminal 132, 162, 232, 262 and a ground reference voltage, with an intermediate node or contact 105, 107, 205, 207 between each inductor/capacitor pair. Similarly, each of the output DC bias circuits 150, 180, 250, 280 is configured as a "shunt inductance" (or shunt-L) circuit, which includes an inductive element 152, 182, 252, 282 and a capacitor 154, 184, 254, 284 connected in series between a transistor output/drain terminal 134, 164, 234, 264 and a ground reference voltage, with an intermediate node or contact 106, 108, 206, 208 between each inductor/capacitor pair. According to an embodiment, contacts 205, 206, 207 (corresponding to nodes 105-107) are implemented as conductive bondpads, which are exposed at the top surface of die 290, and which are configured for attachment of one or more wirebonds. Conversely, contact 208 (corresponding to node 108) is implemented as a portion of a patterned conductive layer on the top surface of substrate 292, and which also is configured for attachment of one or more wirebonds (e.g., wirebonds 282, FIG. 2).

According to an embodiment, inductive elements 222, 252, 272 and capacitors 224, 254, 274 are integrally formed in semiconductor die 290. For example, each of inductors 222, 252, 272 may be implemented as a spiral inductor that is formed from patterned conductive portions of the build-up layers of die 290 (e.g., layers 304, FIGS. 3, 4), and each of capacitors 224, 254, 274 may be implemented as a metal-insulator-metal (MIM) capacitor that is formed in the build-up layers of die 290. In alternate embodiments, some or all of the inductive elements 222, 252, 272 and capacitors 224, 254, 274 may be implemented as surface-mount, "chip" components, which are physically coupled to the top surface of die 290 or substrate 292, and electrically coupled through bondpads or other contacts (not shown) exposed at the top surface of die 290 or substrate 292. Further, in other alternate embodiments, some or all of the inductive elements 222, 252, 272 may be implemented as wirebonds. For example, in the embodiment of FIG. 2, inductive element 282 is implemented as a set of wirebonds that are electrically coupled between the output/drain terminal 264 of final stage transistor 260 and contact 208, and capacitor 284 is implemented as a chip capacitor that is coupled to the top surface of substrate 292.

As illustrated in FIG. 2, the output/drain terminal 264 is configured to enable multiple wirebond arrays 203, 282 to be coupled to the output/drain terminal 264 with angularly offset (e.g., perpendicular) orientations. More specifically, the output/drain terminal 264 has an elongated first conductive bondpad 265 to which wirebond array 203 is connected, and an elongated second conductive bondpad 266 (or "sidepad") to which wirebond array 282 is connected. For reasons that will be apparent in the discussion of FIG. 6, the output/drain terminal 264 also may include an elongated third conductive bondpad 267 (or "sidepad") to which another wirebond array may be connected. In any event, the second and third conductive sidepads 266, 267 may be coupled or connected to opposite ends of the elongated first conductive bondpad 265, and the second and third conductive sidepads 266, 267 may have their longest dimensions oriented perpendicularly to the longest dimension of the first conductive bondpad, in an embodiment.

According to an embodiment, each of capacitors 124, 154, 174, 184, 224, 254, 274, 284 has a sufficiently high capacitance value (e.g., greater than about 60 pF) to ensure that each node/contact 105, 106, 107, 108, 205, 206, 207, 208 corresponds to an RF low-impedance point (e.g., an "RF cold point" or a "pseudo-RF cold point"). In other words, each node/contact 105, 106, 107, 108, 205, 206, 207, 208 represents a low impedance point in the circuit for RF signals. This ensures that minimal RF signal energy is lost through the bias circuits 120, 150, 170, 180, 220, 250, 270, 280.

To provide bias voltages to the input/gate terminals 132, 162, 232, 262 and output/drain terminals 134, 164, 234, 264 of the transistors 130, 160, 230, 260, an external gate or drain DC bias voltage supply 126, 156, 176, 186 (not shown in FIG. 2) is connected to each node/contact 105, 106, 107, 108, 205, 206, 207, 208. More specifically, a driver stage gate supply 126 is connected to node/contact 105, 205 to provide a DC bias voltage to the input/gate terminal 132, 232 of driver stage transistor 130, 230, a driver stage drain supply 156 is connected to node/contact 106, 206 to provide a DC bias voltage to the output/drain 134, 234 of driver stage transistor 130, 230, a final stage gate supply 176 is connected to node/contact 107, 207 to provide a DC bias voltage to the input/gate terminal 162, 262 of final stage transistor 160, 260, and a final stage drain supply 186 is connected to node/contact 108, 208 to provide a DC bias voltage to the output/drain terminal 164, 264 of final stage transistor 160, 260. The driver stage and final stage gate supplies 126, 176 each may provide a DC gate bias voltage in a range of about 0.5 V to about 3.5 V, although the DC gate bias voltages may be lower or higher, as well.

According to an embodiment, the driver stage and final stage drain supplies 156, 186 provide substantially different DC drain bias voltages to transistors 130, 230 and 160, 260, respectively. More particularly, the driver stage drain supply 156 provides a significantly lower DC drain bias voltage to node/contact 106, 206 (and thus to the output/drain 134, 164 of driver transistor 130, 230) than the DC drain bias voltage that is provided by the final stage drain supply 186 to node/contact 108, 208 (and thus to the output/drain terminal 164, 264 of final stage transistor 160, 260). Accordingly, the driver stage drain supply 156 may be referred to as a driver stage low voltage (LV) supply, and the driver stage transistor 130, 230 may be referred to as a low voltage driver stage, whereas the final stage drain supply 186 may be referred to as a final stage high voltage (HV) supply, and the final stage transistor 160, 260 may be referred to as a high voltage final stage.

In a particular embodiment, the driver stage drain supply 156 provides a DC bias voltage of less than about 10 V, and in a more particular embodiment, the driver stage drain supply 156 provides a DC bias voltage of about 5 V. As will be described in more detail in conjunction with FIG. 7, later, the driver stage drain supply 156 preferably supplies a DC bias voltage that can also be utilized by other circuitry in an RF system (e.g., by a pre-amplifier 730, duplexer 760, and/or low noise amplifier (LNA) 750 of a transmitter or transceiver 700, FIG. 7). For example, the driver stage drain supply 156 may be a commercial, off-the-shelf (or standard) power supply, although the driver stage drain supply 156 may be a custom power supply, as well. Conversely, in a particular embodiment, the final stage drain supply 186 provides a DC bias voltage of at least twice as large as the DC bias voltage of the driver stage drain supply 156. For example, the final stage drain supply 186 may provide a DC bias voltage greater than about 20 V (e.g., in a range of 28-32 V or higher). In various embodiments, the ratio of the DC bias voltage provided by final stage drain supply 186 to the DC bias voltage provided by driver stage drain supply 156 is greater than 2 (e.g., in a range between 2 and 10). In a more specific embodiment, the ratio is between about 5.6 and about 6.4 when the DC bias voltage provided by final stage drain supply 186 is about 28-32 V, and the DC bias voltage provided by driver stage drain supply 156 is about 5 V.

According to an embodiment, the driver stage transistor 130, 230 and the final stage transistor 160, 260 are configured differently from each other in order to operate efficiently with the relatively low and relatively high DC drain bias voltages, respectively. Essentially, the driver stage transistor 130, 230 is configured to have a significantly lower power density and a significantly lower drain-source "on" resistance (RDSon) (i.e., the total resistance between the drain terminal 134 and source terminal 135 when the transistor 130, 230 is fully on) than the final stage transistor 160, 260. For example, the driver stage transistor 130, 230 may have a power density in a range of about 0.1 watts per millimeter (W/mm) to about 0.2 W/mm, whereas the final stage transistor 160, 260 may have a power density in a range of about 0.9 W/mm to about 1.3 W/mm (e.g., the power density of the final stage transistor 160, 260 is at least 200 percent greater than (i.e., 3 times) the power density of the driver stage transistor 130, 230, and potentially up to or greater than 10 times the power density of the driver stage transistor 130, 230). Further, the driver stage transistor 130, 230 may have an RDSon in a range of about 5 ohm-mm to about 10 ohm-mm, whereas the final stage transistor 160, 260 may have an RDSon in a range of about 10 ohm-mm to about 15 ohm-mm (e.g., the RDSon of the final stage transistor 160, 260 is greater than, and in some cases up to three times greater than the RDSon of the driver stage transistor 130, 230).

Because the driver stage transistor 130, 230 is configured to operate with a relatively low DC drain bias voltage, the driver stage transistor 130, 230 may be configured to have performance optimized (e.g. lower on resistance (RDSon)). To accomplish this optimization, the driver stage transistor 130, 230 may be designed to have a significantly lower breakdown voltage than the final stage transistor 160, 260. Although the difference in breakdown voltages may be accomplished in a number of ways, according to a particular embodiment, the difference may be achieved by configuring the driver stage transistor 130, 230 with a significantly shorter drift region between the gate and the drain within each transistor finger. To illustrate, FIGS. 3 and 4 depict cross-sectional, side views of portions of the driver amplifier transistor 230 and the final stage amplifier transistor 260 of FIG. 2, in accordance with an embodiment. More specifically, each of FIGS. 3 and 4 depict a cross-sectional, side view through a single transistor finger within the driver amplifier transistor 230 (FIG. 3) and the final stage amplifier transistor 260 (FIG. 4), respectively.

Both the driver amplifier transistor 230 (FIG. 3) and the final stage amplifier transistor 260 (FIG. 4) are integrally formed with the semiconductor die 290. More specifically, the semiconductor die 290 includes a base semiconductor substrate 302, and a plurality of build-up layers 304 over a top surface 303 of the base semiconductor substrate 302 (only a lower portion of the build-up layers 304 are shown in FIGS. 3 and 4 to avoid unnecessary detail). In a particular example embodiment, the base semiconductor substrate 302 is a high-resistivity silicon substrate (e.g., a silicon substrate having bulk resistivity in a range of about 1000 ohm/centimeter (cm) to about 100,000 ohm/cm or greater). Alternatively, the base semiconductor substrate may be a semi-insulating gallium arsenide (GaAs) substrate (e.g., a GaAs substrate having bulk resistivity up to $10^8$ ohm/cm), or another suitable high-resistivity substrate. In still other alternate embodiments, the base semiconductor substrate may be any of multiple variants of a gallium nitride (GaN) substrate, a silicon carbide (SiC) substrate (e.g., to accommodate, for example, GaN epitaxial layers grown on SiC), or other III-V semiconductor substrates. An advantage to the use of a high-resistivity substrate is that such a substrate may enable various on-die circuitry to exhibit relatively low losses, when compared with amplifier dies that do not utilize a high-resistivity substrate. In other embodiments, however, a lower resistivity (or more conductive) substrate may be used.

In an embodiment in which substrate 302 is a high-resistivity substrate, conductive paths may be made between the top surface 303 of the substrate 302 and a conductive backside contact 380 on the bottom surface of the substrate 305 using through substrate vias (TSVs, not shown). Alternatively, for lower resistivity (or more conductive) substrates, conductive paths between the top surface 303 and the backside contact 380 may be made, at least in part, using low resistivity sinker regions. In any event, the backside contact 380 may be connected to a ground (e.g., to coin 294 or thermal vias, FIG. 2), when die 290 is integrated into a larger electrical system, and the TSVs (or sinker regions) may be used to electrically connect the source regions 330, 430 and other components (e.g., inductor 212 and capacitors 224, 254, 274, FIG. 2) to ground.

Each transistor 230, 260 includes gate structure 310, 410 supported by a top surface 303 of the semiconductor substrate 302, along with doped source regions 330, 430 and drain regions 340, 440 (or more generally "current-carrying regions") extending from the top surface 303 into the substrate 302 on either side of the gate structure 310, 410. Each source region 330, 430 and drain region 340, 440, or portions thereof, may have a dopant concentration at a level sufficient to establish ohmic contacts with electrodes or interconnects 336, 436 and 342, 442.

According to an embodiment, each source region 330, 430 may be disposed along or aligned with a first sidewall 320, 420 of the gate structure 310, 410. Further, each drain region 340, 440 may be laterally separated across the surface 303 of the substrate 302 from a second, opposite sidewall 318, 418 of the gate structure 310, 410, and a drift region 350, 450 extends laterally from each drain region 340, 440 to each gate structure 310, 410.

Each transistor 230, 260 also includes a well or diffused region 332, 432 in the semiconductor substrate 302 under the gate structure 310, 410. During operation, a channel or channel region is formed in the well region 332, 432 at a surface 303 of the semiconductor substrate 302 via application of a DC bias voltage (e.g., supplied by driver stage LV drain supply 156 or final stage HV drain supply 186, FIG. 1) to a conductive portion of the gate structure 310, 410. As discussed previously, during operation, the drain region 340 of the driver stage transistor 230 is biased at a significantly lower bias voltage than the bias voltage applied to the drain region 440 of the final stage transistor 260.

The die 290 may include one or more passivation layers 370 covering the surface 303. One or more shield plate(s) 322, 422, 424 may be disposed between adjacent dielectric or passivation layers 370. As indicated in FIGS. 3 and 4, the configuration of the shield plates 322, 422, 424 may be different for the driver stage transistor 230 (which includes only a single shield plate 322) and the final stage transistor 260 (which includes two shield plates 422, 424). In any event, the shield plate(s) 322, 422, 424 may help protect the gate dielectric from damage or degradation arising from charge carriers accelerated under the electric field arising from the drain-source voltage (i.e., "hot carriers"). The shield plate(s) 322, 422, 424 may also help to reduce the maximum electric field in the drift region 350, 450. The shield plate(s) 322, 422, 424 may be grounded or otherwise biased to deter injection of such hot carriers into the oxide or other dielectric material under the gate structure 310, 410 and/or the oxide or other dielectric material over the drift region 350, 450.

According to an embodiment, the length 360 of the drift region 350 in driver stage transistor 230 (i.e., the dimension from sidewall 318 of gate 310 to the drain region 340) is significantly shorter than the length 460 of the drift region 450 in final stage transistor 260 (i.e., the dimension from sidewall 418 of gate 410 to the drain region 440), which results in a significantly lower RDSon and breakdown voltage for the driver stage transistor 230, in comparison with the RDSon and breakdown voltage of the final stage transistor 260. In some embodiments, for example, the length 360 of the drift region 350 in driver stage transistor 230 may be in a range of about 0.5 microns to about 1.5 microns (e.g., about 1.0 microns), whereas the length 460 of the drift region 450 in final stage transistor 260 may be in a range of about 2.0 microns to about 3.5 microns (e.g., about 2.8 microns). In other words, the length 460 of the drift region 450 in the final stage transistor 260 is at least 50 percent larger than the length 360 of the drift region 350 in the driver stage transistor 230 (e.g., in a first range from about 50 percent to about 600 percent larger, or in a second range from about 100 percent to about 200 percent larger). It should be noted that the lengths 360, 460 may be smaller or larger than the above-given ranges, as well. Essentially, establishing a significantly shorter length 360 for the drift region 350 in the driver stage transistor 230 in comparison to the length 460 of the drift region 450 in the final stage transistor 260 causes the driver stage transistor 230 to have a significantly lower (e.g., at least about 40-50 percent lower) RDSon than the RDSon of the final stage transistor 260, and causes the driver stage transistor 230 to have a significantly lower (e.g., at least about 50-60 percent lower) breakdown voltage than the breakdown voltage of the final stage transistor 260. Said another way, the breakdown voltage of the final stage transistor 260 may be significantly higher (e.g., at least about 100-150 percent higher) than the breakdown voltage of the driver stage transistor 230. For example, the breakdown voltage of the driver stage transistor 230 may be in a range of about 25 V to about 40 V (e.g., about 32 V), and the breakdown voltage of the final stage transistor 250 may be in a range of about 65 V to about 80 V (e.g., about 71 V).

In addition to having a lower RDSon, the lower power density of the driver stage transistor 130, 230 enables the driver stage transistor 230 to be designed with more transistor fingers, per unit width (horizontal dimension in FIG. 2), than the final stage transistor 260. By providing more transistor fingers per unit width in the driver stage transistor 230, the RDSon of the driver stage transistor 230 may be reduced even further, with respect to the RDSon of the final stage transistor 260 without consuming significant additional die area. In an embodiment, the reduced RDSon of the driver stage transistor 230 allows the frequency response and efficiency of the driver stage transistor 230 to be optimized for the lower voltage operation of the driver stage transistor 230.

Although, in the above-described embodiment, breakdown voltage and RDSon differences are achieved, at least in part, by implementing a drift region 350 with a shorter length 360 in the driver stage transistor 230 than the length 460 of the drift region 450 that is implemented in the final stage transistor 260, the breakdown voltage and RDSon differences may be accomplished in other ways, as well. For example, breakdown voltage and RDSon differences could be achieved, as well, by using various combinations of different doping levels, different drift region widths (dimension into the page in FIGS. 3, 4), different drift region depths (vertical dimension in FIGS. 3, 4), different drift region lengths, and/or by configuring other characteristics of the driver stage transistor 230 and the final stage transistor 260 differently. In other words, drift regions 350, 450 have one or more different characteristics selected from different doping levels, different drift region widths, different drift region depths, and different drift region lengths.

Referring again to FIGS. 1 and 2, and given the characteristics of the driver and final stage transistors 130, 160, 230, 260 described above and the relatively low output bias voltage provided to the driver stage transistor 130, 230, the low voltage driver transistor 130, 230 may have a significantly lower output impedance (e.g., $Z_1$, or the impedance looking into the drain of the driver stage transistor 130, 230) than a conventional high voltage driver transistor (e.g., in a conventional system in which the driver transistor has its output biased with a higher voltage, such as 28 V or more). For example, an embodiment of a low voltage driver stage transistor 130, 230 may have an output impedance of less than 10 ohms (e.g., from 5-10 ohms), whereas a conventional high voltage driver stage may have an output impedance of 60-100 ohms or more. In contrast, the input impedance of the final stage transistor 160, 260 (e.g., $Z_2$, or the impedance looking into the gate of the final stage transistor 160, 260) may be just a few ohms (e.g., from 1-3 ohms). Thus, in an embodiment, the output impedance of the low voltage driver stage transistor 130, 230, $Z_1$ (e.g., less than about 10 ohms) may match the input impedance $Z_2$ of the final stage transistor 160, 260 (e.g., between about 1 ohm and 3 ohms), facilitating low transformation ratio, easy-to-realize impedance matching between the output of the low voltage driver stage transistor 130, 230 and the input of the final stage transistor 160, 260.

As discussed previously, circuit 100 and IC 200 each include an interstage impedance matching network 140, 240, which is electrically coupled between the output/drain 134, 234 of the low voltage driver stage transistor 130, 230 and the input/gate terminal 162, 262 of the high voltage final stage transistor 160, 260, where the interstage impedance matching network 140, 240 is configured to match the output impedance ($Z_1$) of driver stage transistor 130, 230 to the input impedance ($Z_2$) of final stage transistor 160, 260. Because the driver stage transistor 130, 230 has a significantly lower output impedance ($Z_1$) than a conventional driver stage transistor, as discussed above, the interstage impedance matching network 140, 240 may be characterized by a significantly reduced impedance transformation ratio, when compared with the impedance transformation ratio than would be required for a conventional two-stage amplifier. For example, for a conventional two-stage power amplifier, a 28 V driver stage may require an impedance transformation ratio around 30:1 to 50:1 (e.g., from about 60-100 ohms $Z_1$ to about 2 ohms $Z_2$), while an embodiment of a low voltage driver stage may only require an impedance transformation ratio of less than about 10:1 (e.g., a ratio between about 2.5:1 and about 5:1, corresponding to an impedance transformation ratio from about 5-10 ohms $Z_1$ to about 2 ohms $Z_2$). Because a relatively low impedance transformation ratio may be warranted when implementing an embodiment of the inventive subject matter, the circuit topology of the interstage impedance matching network 140, 240 may be relatively simple (e.g., fewer impedance matching stages and/or passive components), when compared with an interstage impedance matching network for a conventional amplifier, in which a relatively high impedance transformation is needed. Accordingly, losses incurred through the interstage impedance matching network 140, 240 may be significantly reduced (e.g., by 3 dB or more) during operation, when compared with the losses incurred through an interstage impedance matching network of a conventional, two-stage amplifier.

Although transistors 130, 160 and various elements of the input and interstage impedance matching circuits 110, 140 are shown as singular components, the depiction is for the purpose of ease of explanation only. Those of skill in the art would understand, based on the description herein, that transistors 130, 160 and/or certain elements of the input impedance matching circuit 110 and the interstage impedance matching circuit 140 each may be implemented as multiple components (e.g., connected in parallel or in series with each other).

The RF amplifier circuit 100 and IC 200 of FIGS. 1 and 2 may be utilized as a single-path amplifier, which receives an RF signal at RF input 102, 202, amplifies the signal through transistors 130, 160, 230, 260, and produces an amplified RF signal at RF output 104, 204. Alternatively, multiple instances of the RF amplifier circuit 100 or IC 200 may be utilized to provide a multiple-path amplifier, such as a Doherty power amplifier or another type of multi-path amplifier circuit.

Figure 5:
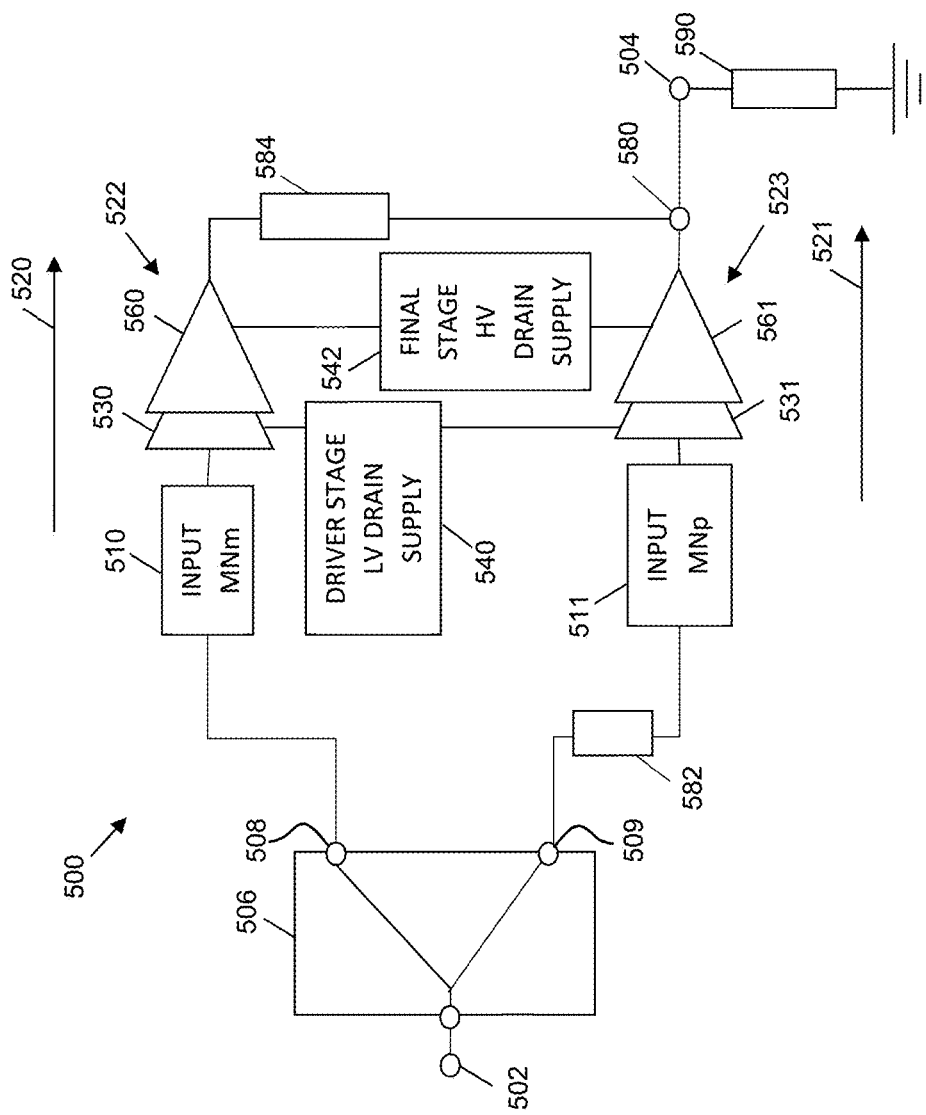
FIG. 5 is a simplified schematic diagram of a Doherty power amplifier, in accordance with an example embodiment.

For example, FIG. 5 is a simplified schematic diagram of a Doherty power amplifier 500, which may include two instances of RF amplifier circuit 100 or IC 200, in accordance with an example embodiment. Doherty amplifier 500 includes an input node 502, an output node 504, a power divider 506 (or splitter), a main amplifier path 520 with a two-stage main amplifier 522 (including driver stage amplifier 530 and final stage amplifier 560), a peaking amplifier path 521 with a two-stage peaking amplifier 523 (including driver stage amplifier 531 and final stage amplifier 561), and a combining node 580. A load 590 may be coupled to the combining node 580 (e.g., through an impedance transformer, not shown) to receive an amplified RF signal from amplifier 500.

Power divider 506 is configured to divide the power of an input RF signal received at input node 502 into main and peaking portions of the input signal. The main input signal is provided to the main amplifier path 520 at power divider output 508, and the peaking input signal is provided to the peaking amplifier path 521 at power divider output 509. During operation in a full-power mode when both the main and peaking amplifier paths 520, 521 are supplying current to the load 590, the power divider 506 divides the input signal power between the amplifier paths 520, 521. For example, the power divider 506 may divide the power equally, such that roughly one half of the input signal power is provided to each path 520, 521 (e.g., for a symmetric Doherty amplifier configuration). Alternatively, the power divider 506 may divide the power unequally (e.g., for an asymmetric Doherty amplifier configuration). Essentially, the power divider 506 divides an input RF signal supplied at the input node 502, and the divided signals are separately amplified along the main and peaking amplifier paths 520, 521. The amplified signals are then combined in phase at the combining node 580.

The amplifier 500 is designed so that phase coherency between the main and peaking amplifier paths 520, 521 is maintained across a frequency band of interest to ensure that the amplified main and peaking signals arrive in phase at the combining node 580, and thus to ensure proper Doherty amplifier operation. More specifically, Doherty amplifier 500 has a "non-inverted" load network configuration. In the non-inverted configuration, the input circuit is configured so that an input signal supplied to the peaking amplifier path 521 is delayed by 90 degrees with respect to the input signal supplied to the main amplifier path 520 at the center frequency of operation, f0, of the amplifier 500. To ensure that the main and peaking input RF signals are supplied to the main and peaking amplifier paths 520, 521 with about 90 degrees of phase difference, as is fundamental to proper Doherty amplifier operation, phase delay element 582 applies about 90 degrees of phase delay to the peaking input signal (i.e., the signal produced at power divider output 509). For example, phase delay element 582 may include a quarter wave transmission line, or another suitable type of delay element with an electrical length of about 90 degrees.

The 90 degree phase delay difference at the inputs to the main and peaking amplifier paths 520, 521 is applied to compensate for a 90 degree phase delay applied to the signal between the output of main amplifier 522 and the combining node 580. This is achieved through an additional delay element 584 between the output of the main amplifier 522 and the combining node 580. The additional delay element 584 also may be configured to perform an impedance inversion, and therefore element 584 may be referred to as a "phase delay and impedance inversion" element or structure.

Each of the main amplifier path 520 and the peaking amplifier path 521 includes an input impedance matching network 510, 511 (input MNm and input MNp) and a multiple-stage power amplifier 522, 523 (e.g., an instance of amplifier 100 implemented using amplifier IC 200, FIGS. 1, 2) coupled in series. The input impedance matching networks 510, 511 may be implemented between the power divider outputs 508, 509 and the inputs of the main and peaking amplifiers 522, 523 (e.g., the gates of the main and peaking driver stage amplifiers 530, 532). In each case, the matching networks 510, 511, may be used to incrementally increase the circuit impedance toward the load impedance and source impedance. All or portions of the input impedance matching networks 510, 511 may be integrated with the IC (e.g., IC 200, FIG. 2) that includes the main and/or peaking amplifiers 522, 523. For example, the input impedance matching networks 510, 511 may be integrally formed with the IC, as is the case with input impedance matching network 210 (FIG. 2). Alternatively, all or portions of the input impedance matching networks 510, 511 may be implemented on a PCB or other substrate to which the IC is mounted.

The multiple-stage power amplifiers 522, 523 (e.g., an instance of amplifier 100 implemented using amplifier IC 200, FIGS. 1, 2) are configured to amplify RF signals conducted through the main and peaking amplifier paths 520, 521. According to various embodiments, the main and peaking driver stage amplifiers 530, 532 and final stage amplifiers 560, 561 each may be implemented, for example, using a field effect transistor (e.g., FETs 230, 260, FIG. 2). As discussed in detail above, each driver stage amplifier 530, 531, or more particularly the FET corresponding to each driver stage amplifier 530, 531, may be configured to operate with a relatively low output bias voltage (e.g., drain bias voltage). To provide the relatively-low output bias voltage to the driver stage amplifiers 530, 531, Doherty amplifier 500 includes a driver stage low voltage (LV) drain supply 540 (e.g., driver stage LV drain supply 156, FIG. 1), which provides the output bias voltages to the driver stage amplifiers. As discussed previously, the driver stage LV drain supply 540 may be configured to provide a DC bias voltage of less than about 10 V to the driver stage amplifiers 530, 531, and in a more particular embodiment, the driver stage LV drain supply 540 may be configured to provide a DC bias voltage of about 5 V to the driver stage amplifiers 530, 531.

Conversely, each final stage amplifier 560, 561, or more particularly the FET corresponding to each final stage amplifier 560, 561, may be configured to operate with a relatively high output bias voltage (e.g., drain bias voltage). To provide the relatively-high output bias voltage to the final stage amplifiers 560, 561, Doherty amplifier 500 includes a final stage high voltage (HV) drain supply 542 (e.g., final stage HV drain supply 186, FIG. 1), which provides the output bias voltages to the final stage amplifiers. As discussed previously, the final stage HV drain supply 542 may be configured to provide a DC bias voltage of 20 V or higher to the final stage amplifiers 560, 561, and in a more particular embodiment, the final stage HV drain supply 542 may be configured to provide a DC bias voltage of in a range of 28-32 V or higher to the final stage amplifiers 560, 561.

During operation of Doherty amplifier 500, the main amplifier 522 is biased to operate in class AB mode, and the peaking amplifier 523 is biased to operate in class C mode. At low power levels, where the power of the input signal at node 502 is lower than the turn-on threshold level of peaking amplifier 523, the amplifier 500 operates in a low-power (or back-off) mode in which the main amplifier 522 is the only amplifier supplying current to the load 590. When the power of the input signal exceeds a threshold level of the peaking amplifier 523, the amplifier 500 operates in a high-power mode in which the main amplifier 522 and the peaking amplifier 523 both supply current to the load 590. At this point, the peaking amplifier 523 provides active load modulation at combining node 580, allowing the current of the main amplifier 522 to continue to increase linearly.

Referring also to FIG. 2, in an embodiment, the main amplifier 522 may be implemented using a first instance of power amplifier IC 200, where driver stage transistor 230 corresponds to driver stage amplifier 530, and final stage transistor 260 corresponds to final stage amplifier 560. Similarly, the peaking amplifier 523 may be implemented using a second instance of power amplifier IC 200, where driver stage transistor 230 corresponds to driver stage amplifier 531, and final stage transistor 260 corresponds to final stage amplifier 561.

Figure 6:
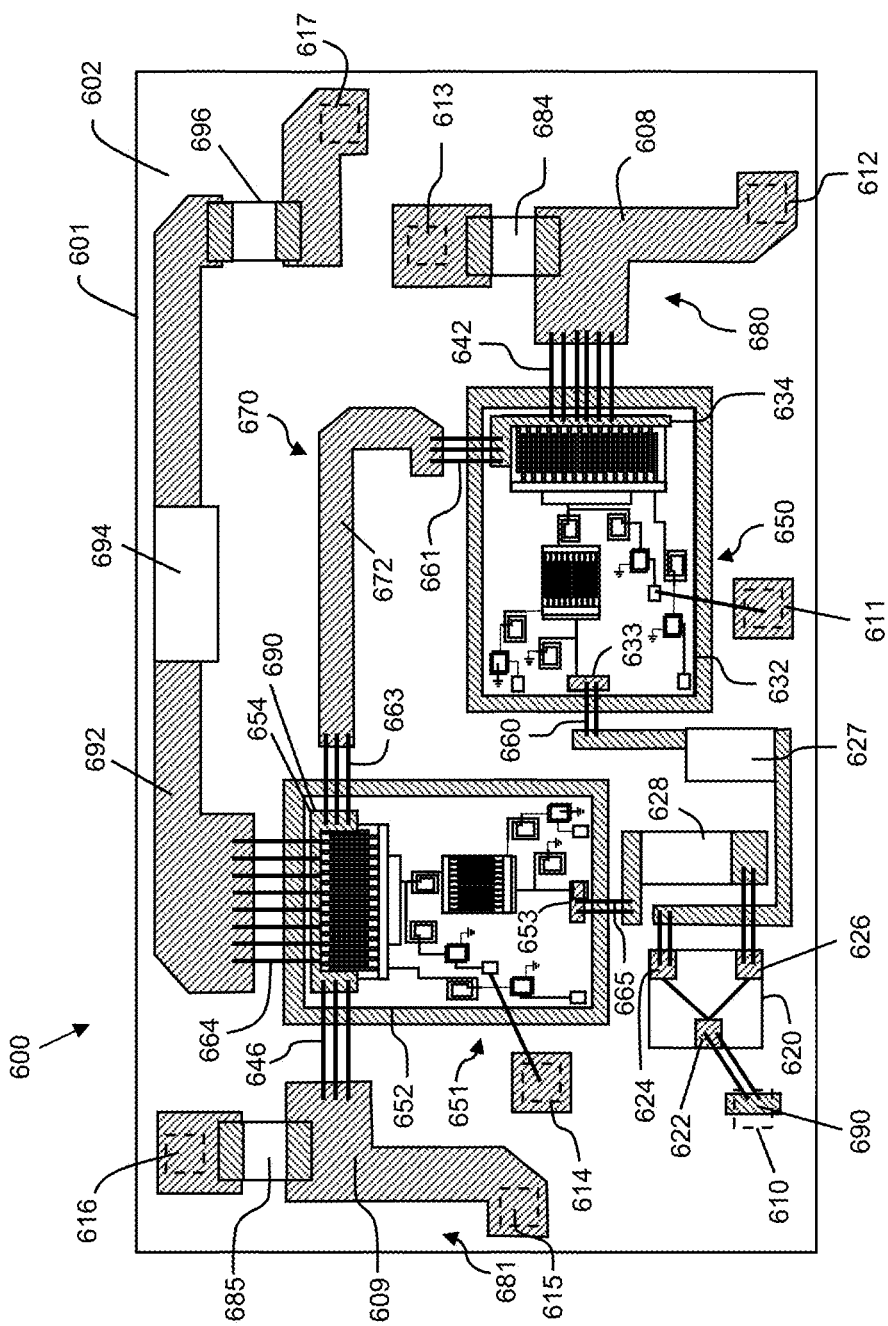
FIG. 6 is a top view of a Doherty amplifier module, in accordance with an example embodiment.

Actual implementations of Doherty amplifier 500, or portions thereof, may be implemented in discrete, packaged power amplifier modules and devices. For example, FIG. 6 is a top view of a Doherty amplifier module 600, in accordance with an example embodiment, in which first and second amplifier die 632, 652 (e.g., two instances of amplifier die 200, FIG. 2) are used to provide the main and peaking amplifiers of a Doherty amplifier.

Doherty amplifier module 600 includes a substrate 601, a power splitter 620 (e.g., power splitter 506, FIG. 5), a main amplifier die 632 (e.g., corresponding to main amplifier 522, FIG. 5), a peaking amplifier die 652 (e.g., corresponding to peaking amplifier 523, FIG. 5), a phase delay and impedance inversion structure 670 (e.g., phase delay and impedance inversion structure 584, FIG. 5), and various other circuit elements, which will be discussed in more detail below. According to an embodiment, with the possible exception of the configurations of the RF output terminals 634, 654, the main amplifier die 632 and the peaking amplifier die 652 may be structurally identical to each other, and to the amplifier IC 200 discussed in detail in conjunction with FIG. 2.

The Doherty amplifier module 600 may be implemented as a land grid array (LGA) module, for example. Accordingly, the substrate 601 has a component mounting surface 602 and a land surface (not numbered) that is on an opposite side of the substrate 601 from the component mounting surface 602. Conductive landing pads 610-617 of the LGA are exposed at the land surface, and are electrically connected through the substrate 601 to overlying conductive features (e.g., contacts 608, 609, 690, and so on). Although module 600 is depicted as an LGA module, module 600 alternatively may be packaged as a pin grid array module, a quad flat no leads (QFN) module, or another type of package. Either way, the component mounting surface 602 and the components mounted to that surface 602 optionally may be covered with an encapsulant material to produce a surface-mount device (e.g., power amplifier device 740, FIG. 7) that is suitable for incorporation into a larger electrical system (e.g., transceiver module 700, FIG. 7). In an alternate embodiment, the components mounted to surface 602 could be contained within an air cavity, which is defined by various structures (not illustrated) overlying the mounting surface 602.

The power splitter 620, which is coupled to the mounting surface 602, includes an input terminal 622 (e.g., input 502, FIG. 5) and two output terminals 624, 626 (e.g., outputs 508, 509, FIG. 5). The input terminal 622 is electrically coupled through wirebonds and conductive contact 690 to landing pad 610, which is configured to receive an input RF signal. The output terminals 624, 626 are electrically coupled (e.g., through additional wirebonds) to main and peaking amplifier paths, respectively. The power splitter 620 is configured to split the power of the input RF signal received through input terminal 622 into first and second RF signals (e.g., main and peaking signals), which are produced at the output terminals 624, 626. In addition, the power splitter 620 may include one or more phase shift elements configured to impart about a 90-degree phase difference between the first and second RF signals provided at output terminals 624, 626 (e.g., to implement the phase shift applied by phase delay element 582, FIG. 5).

The first RF signal produced at output terminal 624 is amplified through a main amplifier path. The main amplifier path includes an input circuit 627, a main amplifier die 632 (e.g., an instance of IC 200, FIG. 2), and a phase delay and impedance inversion structure 670 (e.g., phase delay and impedance inversion element 584, FIG. 5). The input circuit 627 is configured to provide proper impedance matching between the first power splitter output 624 and the input to the main amplifier die 632. The input circuit 627 is electrically coupled (e.g., with wirebonds 660, which correspond to wirebonds 201, FIG. 2) to an RF input terminal 633 (e.g., RF input 202, FIG. 2) of the main amplifier die 632, in order to provide an RF signal for amplification to the main amplifier die 632.

The main amplifier die 632 embodies a two-stage amplifier which may be substantially similar to the two-stage amplifier embodied in amplifier IC 200. For the purpose of brevity, the details of amplifier IC 200 discussed in conjunction with FIG. 2 are not repeated here, but they are intended to apply also to main amplifier die 632. Briefly, the electrical components of main amplifier die 632 include the RF input terminal 633, an input matching network (e.g., input matching network 210, FIG. 2), a driver stage transistor (e.g., driver stage transistor 230, FIG. 2), an interstage matching network (e.g., interstage matching network 240, FIG. 2), an output or final stage transistor (e.g., final stage transistor 260, FIG. 2), and an RF output terminal 634 (e.g., RF output terminal 204, FIG. 2). The driver and final stage transistors are coupled in series between the input and output terminals 633, 634. The driver stage transistor is configured to apply a relatively low gain to the main signal, and the final stage transistor is configured to apply a relatively high gain to the main signal after preliminary amplification by the driver stage transistor.

According to an embodiment, the main amplifier die 632 also includes a first DC bias circuit 650 (e.g., bias circuit 250, FIG. 2), which receives a relatively low bias voltage through a conductive landing pad 611 and a bondpad on the die 632 (e.g., bondpad 206, FIG. 2). The first DC bias circuit 650 conveys the relatively low DC bias voltage from the landing pad 611 to the output (e.g., drain terminal) of the driver stage transistor, as discussed in detail above in conjunction with FIG. 2.

A second DC bias circuit 680 (e.g., bias circuit 280, FIG. 2) is implemented off chip, in an embodiment, and the second DC bias circuit 680 receives a relatively high DC bias voltage through a landing pad 612. The second DC bias circuit 680 may include a conductive contact 608 (e.g., contact 208, FIG. 2) on the mounting surface 602, and wirebonds 642, which electrically couple the contact 608 with the RF output terminal 634 (thus electrically connecting landing pad 612 and the output of the final stage transistor of the main amplifier die 632). The second DC bias circuit 680 conveys the relatively high bias voltage from the landing pad 612 to the output (e.g., drain terminal) of the final stage transistor, as discussed in detail above in conjunction with FIG. 2. Besides the drain bias circuits 650, 680, module 600 also may include additional main amplifier bias circuits to provide gate bias voltages to the driver and final stage transistors of the main amplifier die 632.

As discussed in conjunction with FIG. 2, each of the first DC bias circuit 650 and the second DC bias circuit 680 may be configured as a shunt-L circuit, where each includes an inductive element and a capacitor connected in series between a transistor output and a ground reference voltage, with an intermediate node or contact between each inductor/capacitor pair. The inductor/capacitor pair associated with DC bias circuit 650 may be integrally formed with die 632, and the inductor/capacitor pair associated with DC bias circuit 680 may include wirebonds 642, contact 608, and capacitor 684. A first terminal (or electrode) of capacitor 684 is coupled to contact 608, and a second terminal of capacitor 684 may be coupled to a ground reference through landing pad 613.

An amplified main signal is produced by the main amplifier die 632 at the RF output terminal 634. The amplified main signal is conveyed through the phase delay and impedance inversion structure 670 to the RF output terminal 654 of the peaking amplifier die 652. More specifically, the phase delay and impedance inversion structure 670 includes a series combination of a first wirebond array 661, an inverter line 672 connected to the substrate 601, and a second wirebond array 663. The phase delay and impedance inversion structure 670 has an electrical length of about 90 degrees, in an embodiment.

As will be discussed in more detail below, the output terminal 654 of the peaking amplifier die 652 functions as the combining node 690 (e.g., combining node 580, FIG. 5) of the Doherty amplifier, and the phase delay and impedance inversion structure 670 functions to phase align the amplified RF main signal with an amplified RF peaking signal produced by the peaking amplifier die 652.

Moving back to the power splitter 620, the second RF signal produced at output terminal 626 is amplified through the peaking amplifier path. The peaking amplifier path includes an input circuit 628, and a peaking amplifier die 652 (e.g., an instance of IC 200, FIG. 2). The input circuit 628 is configured to provide proper impedance matching between the second power splitter output 626 and the input to the peaking amplifier die 652. The input circuit 628 is electrically coupled (e.g., with wirebonds 665, which correspond to wirebonds 201, FIG. 2) to an RF input terminal 653 (e.g., RF input 202, FIG. 2) of the peaking amplifier die 652, in order to provide an RF signal for amplification to the peaking amplifier die 652.

The peaking amplifier die 652 embodies a two-stage amplifier, which may be substantially similar to the two-stage amplifier embodied in amplifier IC 200. For the purpose of brevity, the details of amplifier IC 200 discussed in conjunction with FIG. 2 are not repeated here, but they are intended to apply also to peaking amplifier die 652. Briefly, the electrical components of peaking amplifier die 652 include the RF input terminal 653, an input matching network (e.g., input matching network 210, FIG. 2), a driver stage transistor (e.g., driver stage transistor 230, FIG. 2), an interstage matching network (e.g., interstage matching network 240, FIG. 2), an output or final stage transistor (e.g., final stage transistor 260, FIG. 2), and an RF output terminal 654 (e.g., output/drain terminal 264, FIG. 2).

The driver and final stage transistors are coupled in series between the input and output terminals 653, 654. The driver stage transistor is configured to apply a relatively low gain to the peaking signal, and the final stage transistor is configured to apply a relatively high gain to the peaking signal after preliminary amplification by the driver stage transistor.

According to an embodiment, the peaking amplifier die 652 also includes a first DC bias circuit 651 (e.g., bias circuit 250, FIG. 2), which receives a relatively low bias voltage through a conductive landing pad 614 and a bondpad on the die 652 (e.g., bondpad 206, FIG. 2). The first DC bias circuit 651 conveys the relatively low DC bias voltage from the landing pad 614 to the output (e.g., drain terminal) of the driver stage transistor, as discussed in detail above in conjunction with FIG. 2.

A second DC bias circuit 681 (e.g., bias circuit 280, FIG. 2) is implemented off chip, in an embodiment, and the second DC bias circuit 681 receives a relatively high DC bias voltage through a landing pad 615. The second DC bias circuit 681 may include a conductive contact 609 (e.g., contact 208, FIG. 2) on the mounting surface 602, and wirebonds 646, which electrically couple the contact 609 with the RF output terminal 654 (thus electrically connecting landing pad 615 and the output of the final stage transistor of the peaking amplifier die 652). The second DC bias circuit 681 conveys the relatively high bias voltage from the landing pad 615 to the output (e.g., drain terminal) of the final stage transistor, as discussed in detail above in conjunction with FIG. 2. Besides the drain bias circuits 651, 681, module 600 also may include additional peaking amplifier bias circuits to provide gate bias voltages to the driver and final stage transistors of the peaking amplifier die 652.

As discussed in conjunction with FIG. 2, each of the first DC bias circuit 651 and the second DC bias circuit 681 may be configured as a shunt-L circuit, where each includes an inductive element and a capacitor connected in series between a transistor output and a ground reference voltage, with an intermediate node or contact between each inductor/capacitor pair. The inductor/capacitor pair associated with DC bias circuit 651 may be integrally formed with die 652, and the inductor/capacitor pair associated with DC bias circuit 681 may include wirebonds 646, contact 609, and capacitor 685. A first terminal (or electrode) of capacitor 685 is coupled to contact 609, and a second terminal of capacitor 685 may be coupled to a ground reference through landing pad 616.

An amplified peaking signal is produced by the peaking amplifier die 652 at the RF output terminal 654. In an embodiment, and as mentioned above, the RF output terminal 654 also receives the amplified main signal through the phase delay and impedance inversion structure 670, and the RF output terminal 654 functions as a combining node 690 (e.g., combining node 580, FIG. 5) at which the amplified main signal is combined, in phase, with the amplified peaking signal.

According to an embodiment, the RF output terminal 654 (and thus combining node 690) is electrically coupled to a conductive output transformer line 692 at the mounting surface 602 with wirebond array 664. An output impedance matching network 694 and/or a decoupling capacitor 696 may be coupled along output transformer line 692, in an embodiment. The output impedance matching network 694 functions to present the proper load impedance to combining node 690. Although the detail is not shown in FIG. 6, the output impedance matching network 694 may include various discrete and/or integrated components (e.g., capacitors, inductors, and/or resistors) to provide the desired impedance matching. Ultimately, the output transformer line 692 is electrically coupled through the substrate 601 to conductive landing pad 617. Landing pad 617 functions as the RF output node for the module 600.

An embodiment of a module (e.g., Doherty amplifier module 600, FIG. 6) or another device or module that includes one or more instances of amplifier 100 and/or amplifier IC 200 may be further integrated into a larger electrical system. For example the Doherty amplifier module 600 (or another amplifier device that includes an embodiment of an amplifier die) may be included in a transmitter lineup of an RF transmitter or an RF transceiver.

Figure 7:
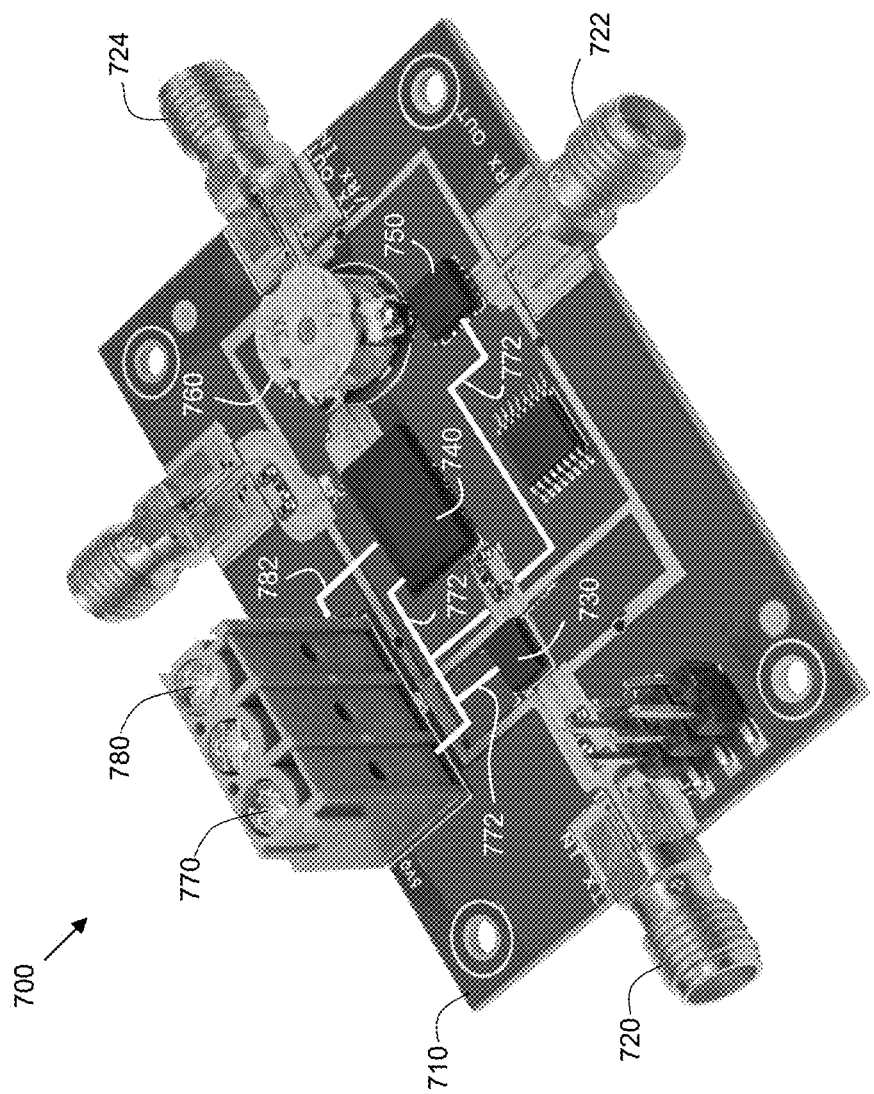
FIG. 7 is a perspective view of a transceiver module, in accordance with an example embodiment.

For example, FIG. 7 is a perspective view of a transceiver module 700, in accordance with an example embodiment. Essentially, the transceiver module 700 houses a transmitter lineup and a receiver lineup. The components of transceiver module 700 are mounted on (or coupled to) a system substrate 710, which may be, for example, a multi-layer PCB or other type of substrate.

The transmitter lineup includes an RF transmit (TX) input connector 720, a pre-amplifier device 730, a power amplifier device 740, a duplexer 760 (e.g., a circulator, in the illustrated embodiment), and an RF transmit-out/receive-in (TX out/RX in) connector 724 coupled in series. The RF transmit input connector 720 is configured to be coupled to an external RF signal source, such as a transmit processor (not illustrated), which produces an analog, modulated RF transmit signal that is to be amplified and transmitted to a remote receiver. The RF transmit input connector 720 receives the RF transmit signal from the RF signal source, and conveys the signal to a first substrate transmission line between the RF transmit input connector 720 and the pre-amplifier device 730. The pre-amplifier device 730 functions as a first amplification stage, which applies a first gain to the RF transmit signal. The pre-amplified RF transmit signal is then conveyed through a second substrate transmission line between the pre-amplifier device 730 and the power amplifier device 740.

For example, the power amplifier device 740 may be a Doherty amplifier module (e.g., Doherty amplifier module 600, FIG. 6), although the power amplifier device 740 alternatively may include a single-path amplifier, or another type of amplifier. In any event, the power amplifier device 740 includes at least one amplifier with a low voltage driver stage amplifier (e.g., driver stage transistor 130, 230, 530, 531, FIGS. 1, 2, 5) and a high voltage final stage amplifier (e.g., final stage transistor 160, 260, 560, 561, FIGS. 1, 2, 5).

The power amplifier device 740 functions as a final amplification stage, which applies additional gain to the RF transmit signal, and the amplified RF transmit signal is then conveyed through a third substrate transmission line between the power amplifier device 740 and the duplexer 760. The duplexer 760 is used to isolate the transmitter and receiver. In various embodiments, the duplexer 760 may include a circulator (as illustrated), an active transmit/receive switch, or another type of duplexer. In any event, the duplexer 760 conveys the amplified RF transmit signal to a fourth substrate transmission line between the duplexer 760 and the RF transmit-out/receive-in connector 724.

The RF transmit-out/receive-in connector 724 is configured to be coupled to a load, such as an antenna, which functions to communicate the amplified RF transmit signal to the remote receiver (e.g., to radiate the amplified RF transmit signal over the air interface). The RF transmit-out/receive-in connector 724 also functions to receive an RF receive signal from the load (e.g., from an antenna, and ultimately from a remote transmitter), and to convey the RF receive signal to the receiver lineup.

The receiver lineup includes the RF transmit-out/receive-in connector 724, the duplexer 760, a low noise amplifier (LNA) device 750, and an RF receive (RX) output connector 722 coupled in series. Upon receiving an RF receive signal from the load (e.g., an antenna), the RF transmit-out/receive-in connector 724 conveys the RF receive signal to the duplexer 760 through the fourth substrate transmission line. The duplexer 760 then conveys the RF receive signal over a fifth substrate transmission line to the LNA device 750. The LNA device 750 amplifies the RF receive signal, and conveys the amplified RF receive signal to a sixth substrate transmission line between the LNA device 750 and the RF receive output connector 722. The RF receive output connector 722 is configured to be coupled to a receive processor (not illustrated), which processes (e.g., demodulates, converts to digital, and otherwise processes) the RF receive signal.

In addition to the above-described circuitry, the transceiver module 700 also includes a low voltage power supply connector 770, a high voltage power supply connector 780, and potentially additional power supply connectors (not discussed below). The low voltage power supply connector 770 and the high voltage power supply connector 780 are configured to be coupled to a low voltage power supply (e.g., driver stage LV drain supply 156, 540, FIGS. 1, 5) and a high voltage power supply (e.g., final stage HV drain supply 186, 542, FIGS. 1, 5), respectively. As described previously, the low voltage power supply (not illustrated) may supply a relatively low DC voltage (e.g., less than 10 V, such as 5 V, or another relatively low voltage), and the high voltage power supply (not illustrated) may supply a relatively high DC voltage (e.g., 28-32 V, or another relatively high voltage).

The low voltage power supply connector 770 is coupled to low voltage substrate conductors 772, which conduct the low voltage DC power received through the low voltage power supply connector 770 to the pre-amplifier 730, the amplifier module 740, and the LNA 750, in an embodiment. Essentially, the low voltage substrate conductors 772 form a portion of a conductive path between the low voltage power supply connector 770 and the pre-amplifier 730, the amplifier module 740 (and more specifically, the outputs/drains of the driver stage amplifier transistor(s) included in the amplifier module 740), and the LNA 750. Accordingly, the transceiver module 700 is configured so that the pre-amplifier 730, the amplifier module 740, and the LNA 750 may utilize the same low voltage power supply for operation. When duplexer 760 is implemented as an active device (e.g., an active transmit/receive switch), duplexer 760 also may receive and utilize the low voltage DC power for its operations. In the amplifier module 740 (e.g., amplifier module 600, FIG. 6), contacts coupled to the low voltage substrate conductors 772 (e.g., contacts 611, 614, FIG. 6) convey the low voltage DC power through bias circuits (e.g., bias circuits 650, 651, FIG. 6) to the output/drain terminals (e.g., terminals 134, 234, FIGS. 1, 2, not numbered in FIG. 6) of the driver stage transistors (e.g., transistors 130, 230, FIGS. 1, 2, not numbered in FIG. 6).

The high voltage power supply connector 780 is coupled to high voltage substrate conductors 782, which conduct the high voltage DC power received through the high voltage power supply connector 780 to the amplifier module 740. Essentially, the high voltage substrate conductors 782 form a portion of a conductive path between the high voltage power supply connector 780 and the amplifier module 740 (and more specifically, the outputs/drains of the final stage amplifier transistor(s) included in the amplifier module 740).

In the amplifier module 740 (e.g., amplifier module 600, FIG. 6), contacts coupled to the high voltage substrate conductors 782 (e.g., contacts 612, 615, FIG. 6) convey the high voltage DC power through bias circuits (e.g., bias circuits 680, 681, FIG. 6) to the output/drain terminals (e.g., terminals 164, 264, 634, 654, FIGS. 1, 2, 6) of the final stage transistors (e.g., transistors 160, 260, FIGS. 1, 2, not numbered in FIG. 6).

As indicated above, embodiments of the inventive subject matter may leverage the use of a single low voltage power supply (e.g., a standardly available 5 V supply) to power multiple RF subsystems of an RF transmitter or transceiver (e.g., pre-amplifier module 730, power amplifier module 740, duplexer 760, and/or a LNA module 750). Accordingly, system costs associated with unique power supplies for some or all of these subsystems may be avoided.

Figure 8:
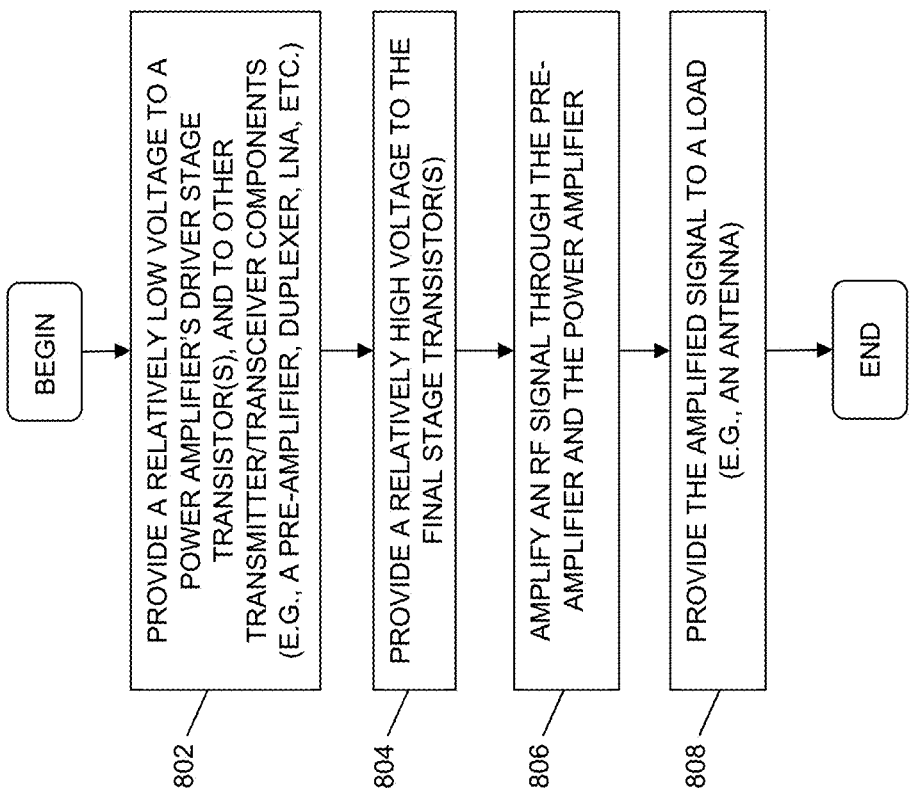
FIG. 8 is a flowchart of a method for operating an amplifier, in accordance with an example embodiment.

FIG. 8 is a flowchart of a method for operating an amplifier with a low voltage driver stage amplifier and a high voltage final stage amplifier, in accordance with an example embodiment. The method may be performed, for example, using various embodiments of a power amplifier (e.g., amplifiers 100, 200, FIG. 1, 2), a Doherty amplifier or an amplifier module (e.g., amplifier 500 and module 600, FIGS. 5, 6), and/or a transmitter or transceiver (e.g., as embodied in transceiver module 700, FIG. 7).

The method may begin, in step 802, by providing a relatively low DC voltage (e.g., under 10 V, such as about 5 V) to bias the output(s) (e.g., drain terminal(s)) of the driver amplifier stage(s)/transistor(s) (e.g., stages/transistors 130, 230, 530, 531, FIGS. 1-3, 5) of a multi-stage power amplifier or amplifier module (e.g., amplifier 100, 200, 500, or module 600, 740, FIGS. 1, 2, 5-7). Step 802 also may include providing the relatively low DC voltage to additional components of a transmitter or transceiver system (e.g., transceiver module 700, FIG. 7). For example, as discussed previously, the relatively low DC voltage may be provided also to a pre-amplifier (e.g., pre-amplifier module 730, FIG. 7), a duplexer, an LNA (e.g., LNA 750, FIG. 7), and/or other system components that are configured to operate using the same relatively low DC voltage that is supplied to the driver amplifier stage(s)/transistor(s). When the additional components are included in a single module (e.g., transceiver module 700, FIG. 7), for example, a first DC voltage supply configured to supply the relatively low DC voltage may be coupled to a first power supply connector of the module (e.g., connector 770, FIG. 7), and conductors (e.g., conductors 772, FIG. 7) may be used to convey the DC voltage to an amplifier module (e.g., module 740, FIG. 7) that includes the driver amplifier stage(s)/transistor(s) and to the additional components.

In step 804, a relatively high DC voltage (e.g., about 28-32 V or higher) is provided to bias the output(s) (e.g., drain terminal(s)) of the final amplifier stage(s)/transistor(s) (e.g., stages/transistors 160, 260, 560, 561, FIGS. 1-3, 5) of a multi-stage power amplifier or amplifier module (e.g., amplifier 100, 200, 500, or module 600, 740, FIGS. 1, 2, 5-7). When the final amplifier stage(s))/transistor(s) are included in a module (e.g., transceiver module 700, FIG. 7), for example, a second DC voltage supply configured to supply the relatively high DC voltage may be coupled to a second power supply connector of the module (e.g., connector 780, FIG. 7), and conductors (e.g., conductors 782, FIG. 7) may be used to convey the DC voltage to an amplifier module (e.g., module 740, FIG. 7) that includes the final amplifier stage(s)/transistor(s). Additional bias voltages (e.g., input/gate bias voltages) also may be provided through additional connector(s) and conductor(s).

In step 806, an RF signal is then provided (e.g., through input 102, 202, 502, 633, 653, 720, FIGS. 1, 2, 5-7) to the pre-amplifier (e.g., pre-amplifier 730, FIG. 7), when included, and to the power amplifier (e.g., amplifier 100, 200, 500, or module 600, 740, FIGS. 1, 2, 5-7), which proceed to amplify the received RF signal. In step 808, the amplified RF signal is then provided to a load (e.g., to an antenna or other load), and the method ends.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier comprising:
   a driver stage amplifier transistor with a first drift region integrated in a semiconductor die and having a driver stage input, a driver stage output, and an output impedance, wherein the driver stage amplifier transistor is configured to operate using a first bias voltage at the driver stage output; and
   a final stage amplifier transistor with a second drift region integrated in the semiconductor die and having a final stage input, a final stage output, and an input impedance, wherein the final stage input is electrically coupled to the driver stage output, and the final stage amplifier transistor is configured to operate using a second bias voltage at the final stage output, and the second bias voltage is at least twice as large as the first bias voltage, and
   wherein the first drift region and the second drift region have one or more different characteristics selected from different doping levels, different drift region widths, different drift region depths, and different drift region lengths.

2. The amplifier of claim 1, wherein:
   the driver stage amplifier transistor has an output impedance;
   the final stage amplifier transistor has an input impedance;
   a ratio of the output impedance of the driver stage amplifier transistor to the input impedance of the final stage amplifier transistor input is less than 10:1; and
   the amplifier further includes an interstage impedance matching circuit electrically coupled between the driver stage output and the final stage input, wherein the interstage impedance matching circuit is configured to perform an impedance transformation from the output impedance of the driver stage amplifier transistor to the input impedance of the final stage amplifier.

3. The amplifier of claim 1, wherein:
   the output impedance of the driver stage amplifier is less than 10 ohms; and
   the second impedance is less than 5 ohms.

4. The amplifier of claim 1, wherein:
   the driver stage amplifier transistor is characterized by a first drain-source on resistance; and
   the final stage amplifier transistor is characterized by a second drain-source on resistance that is greater than the first drain-source resistance.

5. The amplifier of claim 1, wherein:
   the driver stage amplifier transistor is characterized by a first breakdown voltage; and
   the final stage amplifier transistor is characterized by a second breakdown voltage that is at least 100 percent higher than the first breakdown voltage.

6. The amplifier of claim 1, wherein:
   the driver stage amplifier transistor is characterized by a first power density; and
   the final stage amplifier transistor is characterized by a second power density that is at least 200 percent greater than the first power density.

7. The amplifier of claim 1, wherein the semiconductor die is a silicon-based die, the driver amplifier transistor is a first laterally-diffused metal oxide semiconductor (LDMOS) field effect transistor (FET), and the final stage amplifier is a second LDMOS FET.

8. An amplifier comprising:
   a driver stage amplifier transistor integrated in a silicon-based semiconductor die and having a driver stage input, a driver stage output, and an output impedance, wherein the driver stage amplifier transistor is a first laterally-diffused metal oxide semiconductor (LDMOS) field effect transistor (FET), the driver stage amplifier transistor is configured to operate using a first bias voltage at the driver stage output, and the driver stage amplifier transistor has a first transistor finger that includes a first gate structure with a first sidewall, a first drain region, and a first drift region extending from the first sidewall to the first drain region, and wherein the driver stage amplifier transistor is characterized by a first drain-source on resistance; and
   a final stage amplifier transistor integrated in the semiconductor die and having a final stage input, a final stage output, and an input impedance, wherein the final stage amplifier is a second LDMOS FET, the final stage input is electrically coupled to the driver stage output, the final stage amplifier transistor has a second transistor finger that includes a second gate structure with a second sidewall, a second drain region, and a second drift region extending from the second sidewall to the second drain region, and wherein the final stage amplifier transistor is characterized by a second drain-source on resistance that is greater than the first drain-source resistance, and wherein the final stage amplifier transistor is configured to operate using a second bias voltage at the final stage output, and the second bias voltage is at least twice as large as the first bias voltage.

9. The amplifier of claim 8, wherein the first drift region and the second drift region have one or more different characteristics selected from different doping levels, different drift region widths, different drift region depths, and different drift region lengths.

10. The amplifier of claim 8, wherein:
    the first drift region has a first length between the first sidewall and the first drain region; and
    the second drift region has a second length between the second sidewall and the second drain region, wherein the second length is at least 50 percent larger than the first length.

11. An amplifier comprising:
    a driver stage field effect transistor (FET) with a first drift region integrated in a semiconductor die and having a driver stage input, a driver stage output, and an output impedance, wherein the driver stage amplifier transistor is characterized by a first breakdown voltage;
    a final stage FET with a second drift region integrated in the semiconductor die and having a final stage input, a final stage output, and an input impedance, wherein the first drift region and the second drift region have one or more different characteristics selected from different doping levels, different drift region widths, different drift region depths, and different drift region lengths, and wherein the final stage amplifier transistor is characterized by a second breakdown voltage that is at least 100 percent higher than the first breakdown voltage; and
    an interstage impedance matching circuit electrically coupled between the driver stage output and the final stage input, wherein the interstage impedance matching circuit is configured to perform an impedance transformation from the output impedance of the driver stage amplifier transistor to the input impedance of the final stage amplifier.

12. The amplifier of claim 11, wherein a ratio of the output impedance to the input impedance is less than 10:1.

13. The amplifier of claim 11, wherein:
the output impedance of the driver stage FET is less than 10 ohms; and
the input impedance of the final stage FET is less than 5 ohms.

14. The amplifier of claim 11, wherein:
the driver stage FET is characterized by a first power density; and
the final stage FET is characterized by a second power density that is at least 200 percent greater than the first power density.

15. The amplifier of claim 11, wherein:
the driver stage FET is characterized by a first drain-source on resistance; and
the final stage FET is characterized by a second drain-source on resistance that is greater than the first drain-source on resistance.

16. An amplifier comprising:
a driver stage field effect transistor (FET) integrated in a semiconductor die and having a driver stage input, a driver stage output, and an output impedance, wherein the driver stage amplifier transistor is characterized by a first breakdown voltage;
a final stage FET integrated in the semiconductor die and having a final stage input, a final stage output, and an input impedance, wherein the final stage amplifier transistor is characterized by a second breakdown voltage that is at least 100 percent higher than the first breakdown voltage;
an interstage impedance matching circuit electrically coupled between the driver stage output and the final stage input, wherein the interstage impedance matching circuit is configured to perform an impedance transformation from the output impedance of the driver stage amplifier transistor to the input impedance of the final stage amplifier;
an amplifier substrate;
a power amplifier module coupled to the amplifier substrate, wherein the power amplifier module includes the semiconductor die in which the driver stage FET and the final stage FET are integrated;
a first connector coupled to the substrate and configured to receive a first bias voltage;
a second connector coupled to the substrate and configured to receive a second bias voltage;
a first conductive path coupled between the first connector and the driver stage output; and
a second conductive path coupled between the second connector and the final stage output.

17. The amplifier of claim 16, further comprising:
a pre-amplifier module coupled to the substrate; and
a third conductive path coupled between the first connector and the pre-amplifier module.

18. A method of operating an amplifier that includes a driver stage amplifier transistor and a final stage amplifier transistor coupled in series and integrated in a semiconductor die, the method comprising:
providing an output of the driver stage amplifier transistor with a first bias voltage, wherein the driver stage amplifier transistor has a first drift region; and
providing an output of the final stage amplifier transistor with a second bias voltage, wherein the final stage amplifier transistor has a second drift region, the first drift region of the driver stage amplifier transistor and the second drift region have one or more different characteristics selected from different doping levels, different drift region widths, different drift region depths, and different drift region lengths, and the second bias voltage is at least twice the first bias voltage.

19. The method of claim 18, wherein:
the first bias voltage is less than 10 volts; and
the second bias voltage is greater than 20 volts.

20. The method of claim 18, wherein the driver stage amplifier transistor and the final stage amplifier transistor are embodied in a power amplifier module coupled to a substrate, the amplifier further includes a pre-amplifier module coupled to the substrate, and the method further comprises:
providing the pre-amplifier module with the first bias voltage.

* * * * *